(12) United States Patent
Jeong et al.

(10) Patent No.: US 11,735,601 B2
(45) Date of Patent: Aug. 22, 2023

(54) DISPLAY DEVICE AND METHOD OF FABRICATING THE SAME

(71) Applicant: Samsung Display Co., LTD., Yongin-si (KR)

(72) Inventors: Se Hoon Jeong, Yongin-si (KR); Seung Yong Song, Yongin-si (KR); Seung Wook Kwon, Yongin-si (KR); Woo Yong Sung, Yongin-si (KR); Jeong Seok Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 121 days.

(21) Appl. No.: 17/370,477

(22) Filed: Jul. 8, 2021

(65) Prior Publication Data
US 2022/0139962 A1 May 5, 2022

(30) Foreign Application Priority Data
Nov. 5, 2020 (KR) .................. 10-2020-0147157

(51) Int. Cl.
*H01L 27/12* (2006.01)
*H01L 23/00* (2006.01)
(Continued)

(52) U.S. Cl.
CPC ............ *H01L 27/124* (2013.01); *H01L 24/02* (2013.01); *H01L 24/05* (2013.01); *H01L 25/167* (2013.01); *H01L 27/1262* (2013.01); *H10K 50/844* (2023.02); *H10K 59/131* (2023.02); *H10K 71/00* (2023.02); *H01L 24/08* (2013.01); *H01L 2224/02372* (2013.01); *H01L 2224/02381* (2013.01); *H01L 2224/05569* (2013.01); *H01L 2224/08225* (2013.01); *H10K 59/1201* (2023.02)

(58) Field of Classification Search
None
See application file for complete search history.

(56) References Cited

U.S. PATENT DOCUMENTS

2015/0195915 A1    7/2015   Namkung
2017/0345802 A1* 11/2017   Sung .................. H01L 33/54
(Continued)

FOREIGN PATENT DOCUMENTS

| KR | 10-2015-0081563 | | 7/2015 |
|---|---|---|---|
| KR | 10-2020-0066416 | | 6/2020 |
| KR | 20230020236 A | * | 2/2023 |

*Primary Examiner* — Michael Lebentritt
(74) *Attorney, Agent, or Firm* — Kile Park Reed & Houtteman PLLC

(57) ABSTRACT

A display device includes a substrate including a first surface and a second surface, pixels and first lines disposed on the first surface of the substrate, a first protective layer disposed on the second surface of the substrate and overlapping the pixels and the first lines, via holes penetrating the substrate and the first protective layer and exposing an area of each of the first lines, second lines disposed on a surface of the first protective layer and electrically connected to the first lines through the via holes, respectively, and pads disposed on the surface of the first protective layer and electrically connected to the second lines, respectively. The first protective layer includes openings corresponding to the via holes and also includes a photoresist material.

19 Claims, 25 Drawing Sheets

(51) Int. Cl.
  *H01L 25/16* (2023.01)
  *H10K 50/844* (2023.01)
  *H10K 59/131* (2023.01)
  *H10K 71/00* (2023.01)
  *H10K 59/12* (2023.01)

(56) References Cited

U.S. PATENT DOCUMENTS

2019/0340959 A1\* 11/2019 Park .................... H10K 50/844
2020/0176710 A1   6/2020 Kishimoto et al.
2023/0044290 A1\* 2/2023 Kim ..................... H01L 33/505

\* cited by examiner

DISPLAY DEVICE AND METHOD OF FABRICATING THE SAME

CROSS-REFERENCE TO RELATED APPLICATION(S)

This application claims priority to and benefits of Korean Patent Application No. 10-2020-0147157 under 35 U.S.C. § 119, filed in the Korean Intellectual Property Office on Nov. 5, 2020, the entire contents of which are incorporated herein by reference.

BACKGROUND

1. Technical Field

Embodiments of the disclosure relate to a display device and a method of fabricating the same.

2. Description of the Related Art

Recently, interest in information display has been increasing. Accordingly, research and development on display devices is continuously being conducted.

SUMMARY

An aspect of the disclosure may be to provide a display device including a protective layer and a method of fabricating the same.

Aspects of the disclosure are not limited to the above, and other aspects that are not mentioned herein will be clearly understood by those of ordinary skill in the art from the following description.

A display device according to an embodiment of the disclosure may include a substrate including a first surface and a second surface, pixels and first lines disposed on the first surface of the substrate, a first protective layer disposed on the second surface of the substrate and overlapping the pixels and the first lines, via holes penetrating the substrate and the first protective layer and exposing an area of each of the first lines, second lines disposed on a surface of the first protective layer and electrically connected to the first lines through the via holes, respectively, and pads disposed on the surface of the first protective layer and electrically connected to the second lines, respectively, wherein the first protective layer includes openings corresponding to the via holes, and the first protective layer includes a photoresist material.

In an embodiment, the first protective layer may have a thickness in a range of about 10 μm to about 200 μm.

In an embodiment, the first protective layer may have a modulus in a range of about 1 MPa to about 5 GPa.

In an embodiment, the first protective layer may include an organic photoresist material that may be cured at about 100° C. or lower.

In an embodiment, the display device may further include a second protective layer disposed on the second surface of the substrate and overlapping the first protective layer and the second lines, wherein the first protective layer and the second protective layer may constitute a lower protective layer disposed on the second surface of the substrate.

In an embodiment, the second protective layer and first protective layer may include a same photoresist material.

In an embodiment, the second protective layer and the first protective layer may include different photoresist materials.

In an embodiment, the lower protective layer may have a thickness in a range of about 20 μm to about 200 μm.

In an embodiment, the lower protective layer may have a modulus in a range of about 1 MPa to about 5 GPa.

In an embodiment, the second protective layer may include an organic photoresist material that may be cured at about 100° C. or lower.

In an embodiment, a surface of the second protective layer and surfaces of the pads may be at a same height.

In an embodiment, the display device may further include an upper protective layer disposed on the first surface of the substrate and overlapping the pixels and the first lines.

In an embodiment, at least one of the pixels may overlap at least one of the pads.

In an embodiment, at least one of the pixels may overlap at least one of the via holes.

In an embodiment, the display device may further include a circuit board disposed on the second surface of the substrate and electrically connected to the pads.

A method of fabricating a display device according to an embodiment of the disclosure may include preparing a substrate including a first surface and a second surface, forming pixels and first lines on the first surface of the substrate, forming an upper protective layer on the first surface of the substrate to overlap the pixels and the first lines, forming a photoresist film on the second surface of the substrate using a photoresist material, forming a first protective layer by etching the photoresist film in a plurality of areas each corresponding to an area of each of the first lines through a photo lithography process, forming via holes in the substrate using the first protective layer as a mask to expose the area of each of the first lines, forming second lines on the second surface of the substrate, on which the first protective layer may be formed, the second lines corresponding to the first lines and being electrically connected to the first lines through the via holes, forming pads electrically connected to the second lines on the second surface of the substrate, and forming a second protective layer on the second surface of the substrate to overlap the first protective layer and the second lines.

In an embodiment, the forming of the photoresist film may include applying the photoresist material on the second surface of the substrate through a liquid coating process, and thermally curing the photoresist material at about 100° C. or lower.

In an embodiment, a lower protective layer including the first protective layer and the second protective layer may be formed to a thickness in a range of about 20 μm to about 200 μm.

In an embodiment, the second protective layer may be formed on the second surface of the substrate to planarize an upper portion of the second surface of the substrate on which the second lines and the pads may be provided.

Detailed matters of other embodiments are incorporated in the detailed description and drawings.

DETAILED DESCRIPTION OF THE EMBODIMENTS

Figure 1:
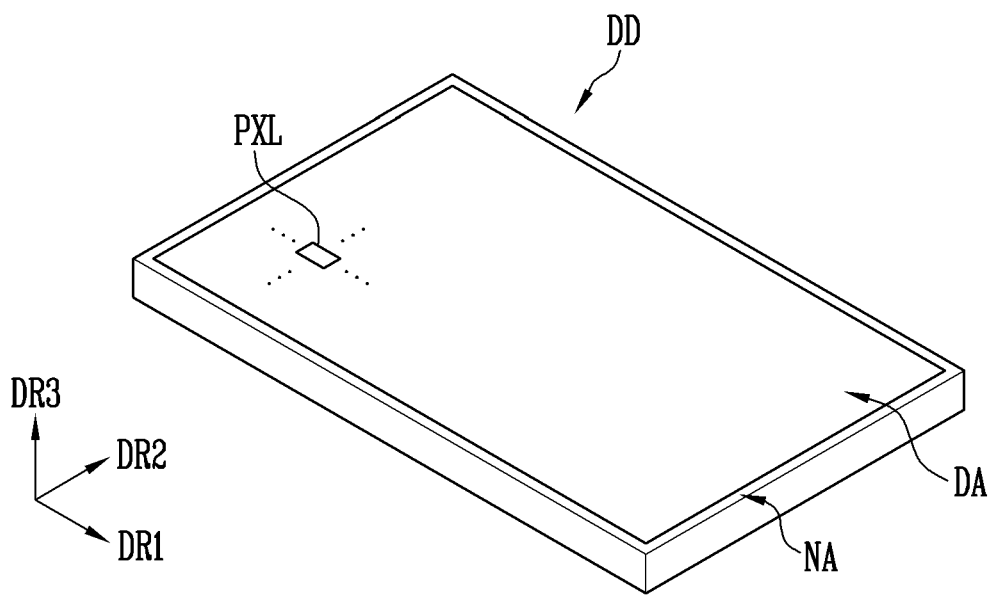
FIG. 1 is a perspective view schematically illustrating a display device according to an embodiment of the disclosure.

As the description allows for various changes and numerous embodiments, certain embodiments will be illustrated in the drawings and described in detail in the written description.

The singular forms "a," "an," and "the" as used herein are intended to include the plural forms as well (and vice versa) unless the context clearly indicates otherwise. The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The disclosure is not limited to the following embodiments and may be embodied in various forms. Each of the embodiments disclosed below may be implemented alone, or may be implemented in combination with at least one other embodiment.

In the drawings, some elements that may not directly relate to the features of the disclosure may be omitted for better understanding. Some elements in the drawings may be somewhat exaggerated in size or ratio. The same reference numerals and symbols are assigned to the same or similar elements throughout the drawings even when they are illustrated on different drawings, and redundant descriptions thereof will be omitted.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that when an element (or a region, a layer, a portion, or the like) is referred to as "being on", "connected to" or "coupled to" another element in the specification and in the claims, it can be directly disposed on, connected or coupled to another element mentioned above, or intervening elements may be disposed therebetween. For example, when a first feature is described as being "disposed on a surface" and a second feature is described as being "disposed on the surface", one or more intervening features may be present between one or both of the first and second features and the surface.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element, or that the first element and second element may be on opposite sides of a plane. In a case in which a third element intervenes between the first and second element, the first and second element may be understood as being indirectly opposed to one another, although still facing each other.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About", "approximately", and "substantially" are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
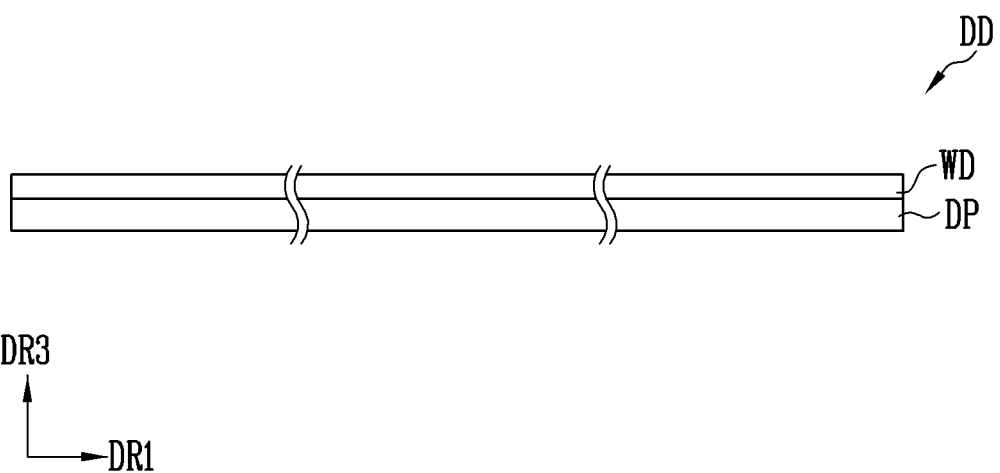
FIGS. 2A and 2B are cross-sectional views schematically illustrating display devices according to embodiments of the disclosure.
Figure 2B:
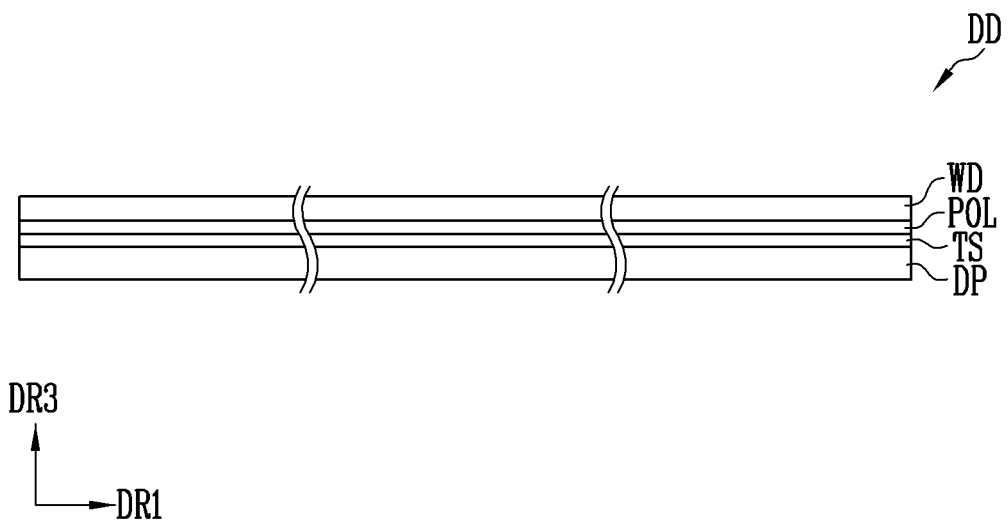
Figure 3A:
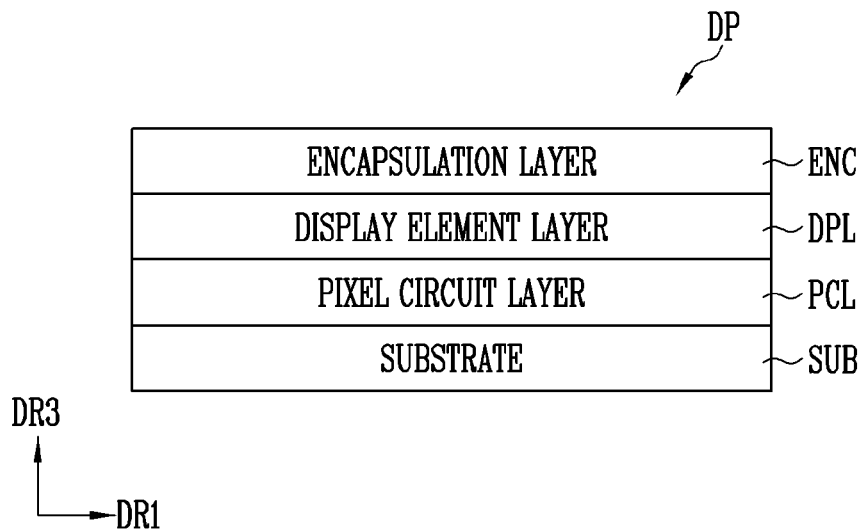
FIGS. 3A and 3B are cross-sectional views schematically illustrating configurations of a display panel according to an embodiment of the disclosure.
Figure 3B:
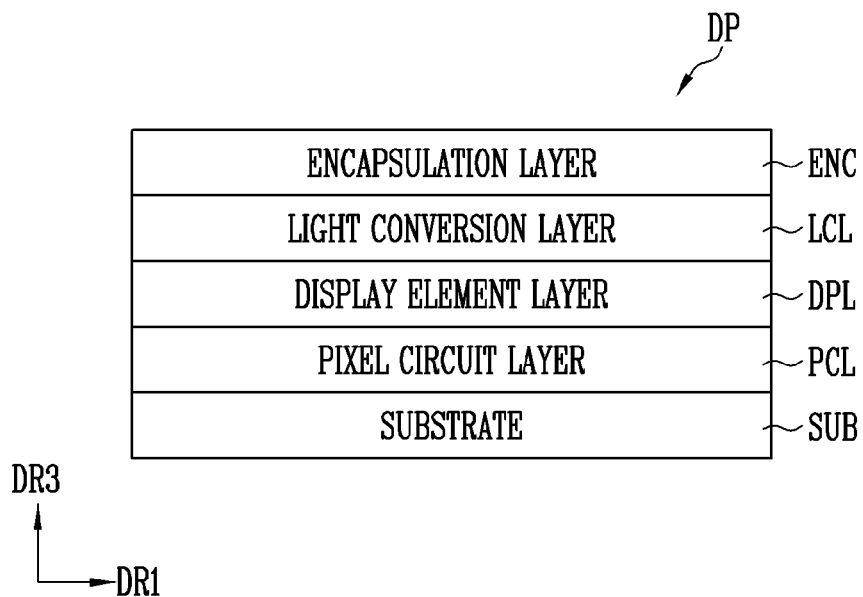

FIG. 1 is a perspective view schematically illustrating a display device DD according to an embodiment of the disclosure. FIGS. 2A and 2B are cross-sectional views schematically illustrating display devices DD according to embodiments of the disclosure. FIGS. 3A and 3B are cross-sectional views schematically illustrating configurations of a display panel DP according to an embodiment of the disclosure.

First, referring to FIG. 1, the display device DD may include a display area DA and a non-display area NA (also referred to as a "bezel area"). The display area DA may be an area that includes pixels PXL to display an image. The non-display area NA may be an area other than the display area DA, and an image may not be displayed in the non-display area NA.

The display area DA may have various shapes, and may include pixels PXL arranged according to a certain rule. For example, the display area DA may have various shapes including a rectangular shape, a circular shape, or an elliptical shape. The pixels PXL may be arranged in the display area DA according to various arrangement structures including a stripe or PenTile® arrangement.

The display area DA may be formed on at least one surface of the display device DD. As an example, the display area DA may be formed on the front surface of the display device DD, and may be additionally formed on the side surface and/or the rear surface of the display device DD.

The non-display area NA may be positioned around the display area DA, and may optionally include lines, pads, and/or a driving circuit connected to the pixels PXL of the display area DA. When the area of the non-display area NA may be reduced, the size of the display area DA may be increased without increasing the size (e.g., area) of the display device DD. Therefore, a larger screen may be provided. In the case in which the non-display area NA is reduced, when a multi-screen display device is implemented using multiple display devices DD, visual recognition of a boundary between the display devices DD may be minimized and a more natural screen may be configured.

The display device DD may be provided in various shapes. As an example, the display device DD may be provided in a rectangular plate shape, but the disclosure is not limited thereto. For example, the display device DD may have a shape such as a circular shape or an elliptical shape. Although FIG. 1 illustrates that the display device DD includes an angled corner, the disclosure is not limited thereto. For example, the display device DD may include a curved corner.

For convenience, FIG. 1 illustrates that the display device DD has a rectangular plate shape including a pair of long sides and a pair of short sides. An extending direction of the long side may be indicated by a first direction DR1, an extending direction of the short side may be indicated by a second direction DR2, and a direction perpendicular to the extending directions of the long side and the short side (e.g., a thickness or height direction of the display device DD) may be indicated by a third direction DR3. However, this may be changed according to the shape of the display device DD.

The display device DD may have flexibility so that deformation occurs in at least one area, or may not have flexibility so that substantial deformation does not occur in the entire area. For example, the display device DD may be a flexible display device or a rigid display device. When the display device DD has flexibility in at least one area, the display device DD may be folded, bent, or rolled in the flexible area.

Referring to FIG. 2A, the display device DD may include a display panel DP and a window WD disposed above the display panel DP. In an embodiment, the window WD may be integrally fabricated with the display panel DP. For example, the window WD may be directly formed on one surface of the display panel DP. In another embodiment, after the window WD may be fabricated separately from the display panel DP, the window WD may be connected to the display panel DP through an optically clear adhesive (OCA).

The display panel DP may include pixels PXL for displaying an image, and may be a display panel of various types and/or structures. As an example, the display panel DP may be a self-luminous display panel such as an organic light emitting display panel (OLED panel) using organic light emitting diodes as a light emitting element, a nano/micro-scale light emitting diode display panel (nano/micro LED panel) using nano/micro-scale light emitting diodes, which have, but are not limited to, a size of a nano/micro scale, as a light emitting element, a quantum dot organic light emitting display panel (QD OLED panel) using organic light emitting diodes and quantum dots, or a quantum dot nano/micro-scale light emitting diode display panel (QD nano/micro LED panel) using nano/micro-scale light emitting diodes and quantum dots. Alternatively, the display panel DP may be a non-emissive display panel such as a liquid crystal display panel (LCD panel), an electrophoretic display panel (EPD panel), or an electro-wetting display panel (EWD panel). In case that the non-emissive display panel is used as the display panel DP, the display device DD may further include a separate light source (e.g., a light emitting unit) for supplying light to the display panel DP.

The window WD for protecting the exposed surface of the display panel DP may be provided on the display panel DP. The window WD may protect the display panel DP from external impact, and may provide an input surface and/or a display surface to a user.

The window WD may include various materials including glass or plastics, and may have a single layer or multiple layers. The window WD may or may not have flexibility in at least one area.

Referring to FIG. 2B, the display device DD may further include at least one of a touch sensor TS and a polarization layer POL. For example, the display device DD may include the touch sensor TS and the polarization layer POL provided to overlap each other between the display panel DP and the window WD. The display device DD may further include input sensors or sensors (e.g., a fingerprint sensor, a pressure sensor, a temperature sensor, etc.) having various types and/or different schemes, and/or various functional layers.

The touch sensor TS may be disposed on at least one surface of the display panel DP to detect a touch input by a user. As an example, the touch sensor TS may be provided on the front surface of the display panel DP (the upper surface on which an image may be displayed) so as to be disposed between the display panel DP and the window WD, but the disclosure is not limited thereto.

In an embodiment, the touch sensor TS may be integrally fabricated with the display panel DP, the polarization layer POL, and/or the window WD. For example, sensor electrodes (or sensor elements) for configuring the touch sensor TS may be formed on (e.g., directly formed on) a surface of the display panel DP, the polarization layer POL, and/or the window WD.

In another embodiment, the touch sensor TS may be fabricated separately from the display panel DP, the polarization layer POL, and the window WD, and then provided adjacent to (e.g., around) the display panel DP. For example, the touch sensor TS may be attached to at least one surface of the display panel DP.

The touch sensor TS may be a touch sensor of various types and/or structures. For example, the touch sensor TS may be a self- or mutual capacitance type touch sensor, a resistive type touch sensor, a piezoelectric type touch sensor, an ultrasonic type touch sensor, and/or a hybrid type touch sensor in which different types of sensors may be combined.

The polarization layer POL may be provided on the display surface (e.g., the front surface) of the display panel DP in order to improve the quality of the image displayed on the display device DD. For example, the polarization layer POL may be provided between the touch sensor TS and the window WD, but the position of the polarization layer POL may be variously changed according to embodiments. For example, in another embodiment, the polarization layer POL may be directly formed or attached to a surface of the display panel DP.

In an embodiment, the polarization layer POL may be integrally fabricated with the display panel DP, the touch sensor TS, and/or the window WD. For example, a polarizer for configuring the polarization layer POL may be formed on (e.g., directly formed on) a surface of the display panel DP, the touch sensor TS, and/or the window WD.

In another embodiment, the polarization layer POL may be fabricated separately from the display panel DP, the touch sensor TS, and the window WD, and then provided on the display surface of the display panel DP. For example, the polarization layer POL may be attached on a surface of the display panel DP, the touch sensor TS, and/or the window WD.

Referring to FIG. 3A, the display panel DP may include a substrate SUB, and a pixel circuit layer PCL, a display element layer DPL, and an encapsulation layer ENC, which may be sequentially disposed on a surface of the substrate SUB. However, the structure of the display panel DP may be variously changed according to embodiments.

For example, in case that the display panel DP is a passive display panel, the pixel circuit layer PCL may be omitted. In this case, only lines for driving the pixels PXL may be disposed around the display element layer DPL (e.g., lower or upper portion), or the lines may be connected to (e.g., directly connected to) and/or formed on the display element layer DPL.

The substrate SUB may be a member for configuring a base layer of the display panel DP, and may be a rigid or flexible substrate (or film). In an embodiment, in case that the substrate SUB is a rigid substrate, the substrate SUB may be a glass substrate, a quartz substrate, a glass ceramic substrate, or a crystalline glass substrate. In another embodiment, in case that the substrate SUB is a flexible substrate, the substrate SUB may be a film substrate or a plastic substrate including a polymer organic material. The substrate SUB may include fiber glass reinforced plastic (FRP).

The pixel circuit layer PCL (also referred to as a "circuit layer", a "line layer", or a "backplane") may be provided on a surface of the substrate SUB. The pixel circuit layer PCL may include circuit elements for configuring the pixel circuit of each pixel PXL, and various lines connected to the circuit elements. For example, the pixel circuit layer PCL may include transistors and a storage capacitor constituting the pixel circuit of each pixel PXL, and gate lines, data lines, and power lines connected to each pixel circuit. The gate lines may include at least scan lines, and may optionally further include other types of control lines. The pixel circuit layer PCL may further include an insulating layer of at least one layer.

The display element layer DPL may be provided on the pixel circuit layer PCL. The display element layer DPL may include a light emitting element constituting a light source of each pixel PXL. In an embodiment, the light emitting element may be an organic light emitting diode or an inorganic light emitting diode (e.g., a nano/micro-scale inorganic light emitting diode having a size of nano/micro scale), but the disclosure is not limited thereto.

The encapsulation layer ENC may be provided on the display element layer DPL. The encapsulation layer ENC may be an encapsulation substrate (or an upper substrate), or a single or multilayer encapsulation layer (e.g., a thin film encapsulation layer). The encapsulation layer ENC may protect the pixels PXL by preventing external air and moisture from penetrating into the display element layer DPL and the pixel circuit layer PCL.

In case that the encapsulation layer ENC may be an encapsulation substrate, the encapsulation substrate may be connected to the substrate SUB by a sealing material or the like. For example, the encapsulation substrate may be attached to a surface of the substrate SUB provided with the pixels PXL by a sealing material.

In case that the encapsulation layer ENC may be a single or multilayer encapsulation layer, the single or multilayer encapsulation layer may include an inorganic film of at least one layer and/or an organic film of at least one layer. In an embodiment, in case that the encapsulation layer ENC may be a multilayer encapsulation layer (e.g., a multilayer thin-film encapsulation layer), the multilayer encapsulation layer may include an inorganic film and/or an organic film. For example, the encapsulation layer ENC may have a multi-layer structure in which an inorganic film, an organic film, and an inorganic film may be sequentially stacked on each other.

Referring to FIG. 3B, the display panel DP may further include a light conversion layer LCL for converting light emitted from the display element layer DPL. For example, when it is assumed that the display panel DP emits light in the upper direction of the display element layer DPL (e.g., the third direction DR3) to display an image from the front of the display panel DP, the light conversion layer LCL may be disposed on the display element layer DPL. As an example, the light conversion layer LCL may be provided between the display element layer DPL and the encapsulation layer ENC.

The light conversion layer LCL may include a color filter including a color filter material of a color corresponding to the color of each pixel PXL and/or color/wavelength conversion particles (e.g., quantum dots) corresponding to the color, and may convert light generated in each pixel area of the display element layer DPL. For example, the light conversion layer LCL may selectively transmit light of a specific wavelength band among the lights generated from the display element layer DPL, and/or may convert the wavelength band of light emitted from the display element layer DPL.

In FIGS. 3A and 3B, embodiments of the configuration of the display panel DP are schematically described on the assumption that the display panel DP may be a light emitting display panel, but the disclosure is not limited thereto. For example, the configuration of the display panel DP may be variously changed according to the type of the display device DD.

Figure 4:
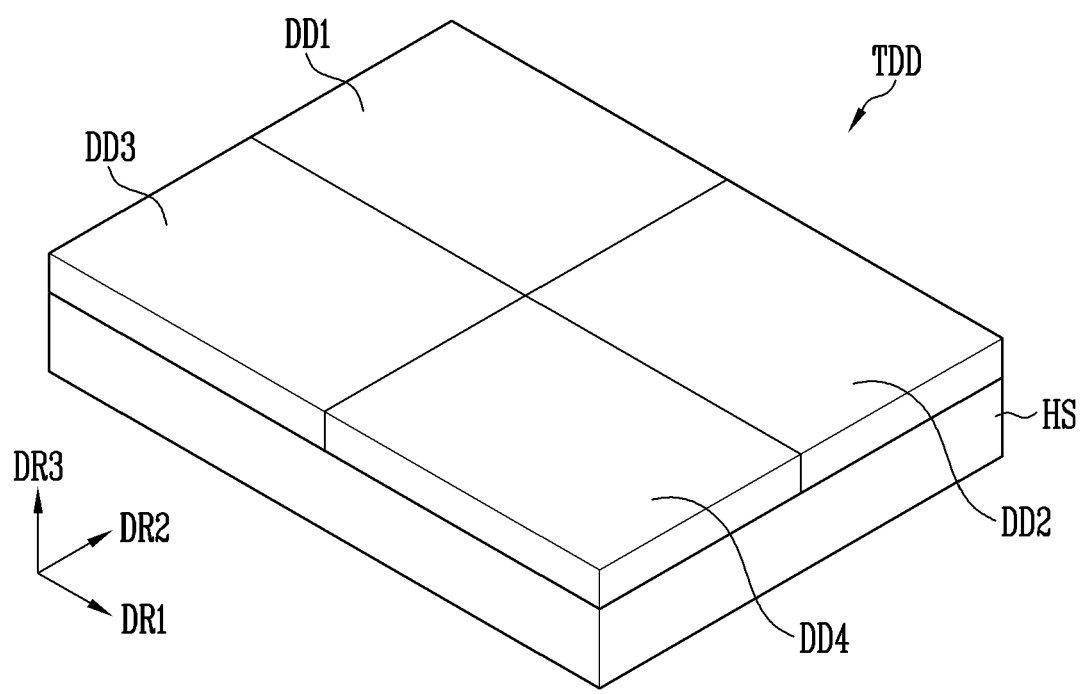
FIG. 4 is a perspective view schematically illustrating a multi-screen display device according to an embodiment of the disclosure.
Figure 5:
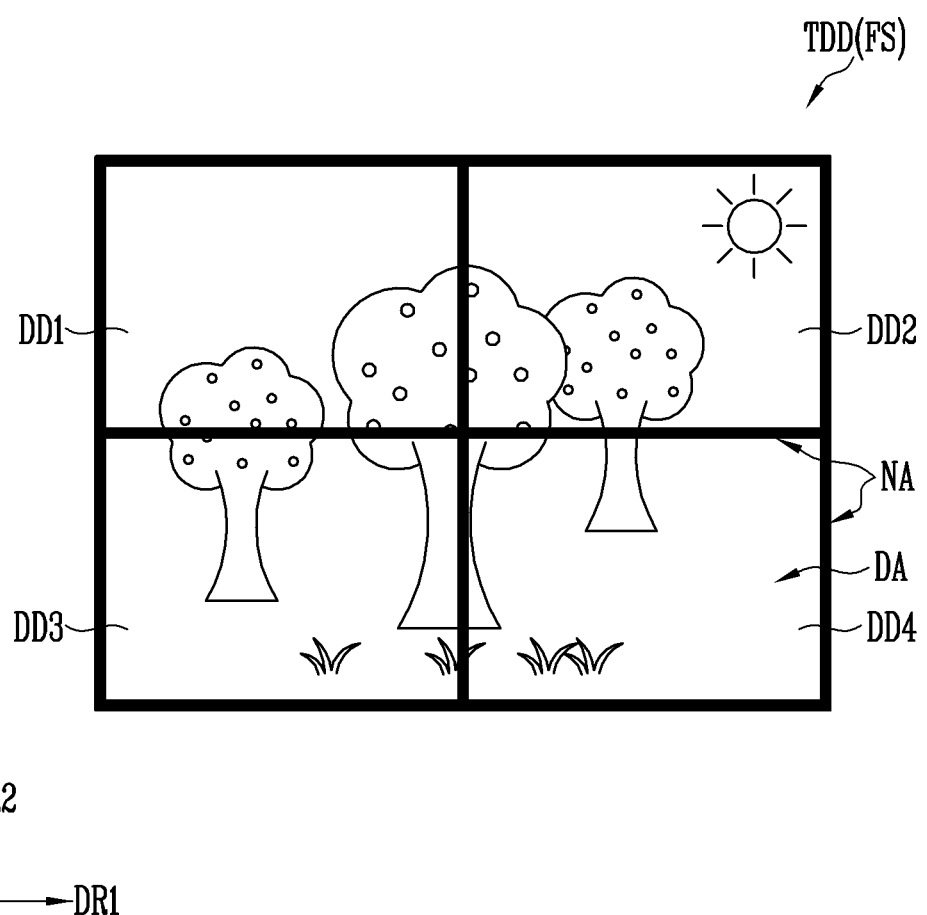
FIG. 5 is a plan view schematically illustrating a multi-screen display device according to an embodiment of the disclosure.

FIG. 4 is a perspective view schematically illustrating a multi-screen display device TDD according to an embodiment of the disclosure. FIG. 5 is a plan view schematically illustrating the multi-screen display device TDD according to an embodiment of the disclosure. As an example, FIG. 5 illustrates a front surface FS (e.g., a display surface) of the multi-screen display device TDD of FIG. 4.

First, referring to FIG. 4, the multi-screen display device TDD (also referred to as "tiled display") may include multiple display devices DD1 to DD4 and a housing HS. For example, the multi-screen display device TDD may include the display devices DD1 to DD4 arranged in a matrix form in the first and/or second directions DR1 and DR2.

The display devices DD1 to DD4 may display individual images, or may divide one image and display the divided images. In an embodiment, the display devices DD1 to DD4 may include display panels of a same type, structure, size, and/or scheme, but the disclosure is not limited thereto.

The housing HS may physically couple the display devices DD1 to DD4 so that the display devices DD1 to DD4 may constitute one multi-screen display device TDD. For example, the housing HS may have a fastening member and/or a groove structure for supporting the display devices DD1 to DD4 under the display devices DD1 to DD4 and stably fixing the display devices DD1 to DD4.

Referring to FIG. 5, the display devices DD1 to DD4 may display an image in each display area DA, and may not display an image in the non-display area NA of each of the display devices DD1 to DD4. Therefore, the image displayed on the screen of the multi-screen display device TDD may be disconnected due to the non-display area NA (e.g., a seam area) located in the boundary area between the display devices DD1 to DD4.

In case that the width and/or the area of the non-display area NA of the display devices DD1 to DD4 (especially, the seam area between the display devices DD1 to DD4) may be reduced, or in case that the non-display area NA may be substantially removed, it may be possible to prevent or alleviate visual recognition of the boundary area between the display devices DD1 to DD4, and to display an image that continues more naturally even in the boundary area. Therefore, it may be possible to alleviate the sense of disconnection in the image displayed on the screen of the multi-screen display device TDD.

To this end, the display device DD according to embodiments of FIGS. 6A to 8D, which will be described later, may include a rear bonding structure connected to an external driving circuit (e.g., a circuit board, etc.) through pads formed on the rear surface. Therefore, the non-display area NA of each of the display devices DD1 to DD4 may be reduced or minimized. In the display device DD according to an embodiment of FIGS. 10 and 11, one area of the display panel DP may be bent. Accordingly, by applying a bending structure (e.g., a bent COP structure) that mounts and/or connects a driving circuit (or a circuit board, etc.) to the area located at the rear surface, the non-display area NA of each of the display devices DD1 to DD4 may be reduced or minimized.

Figure 6A:
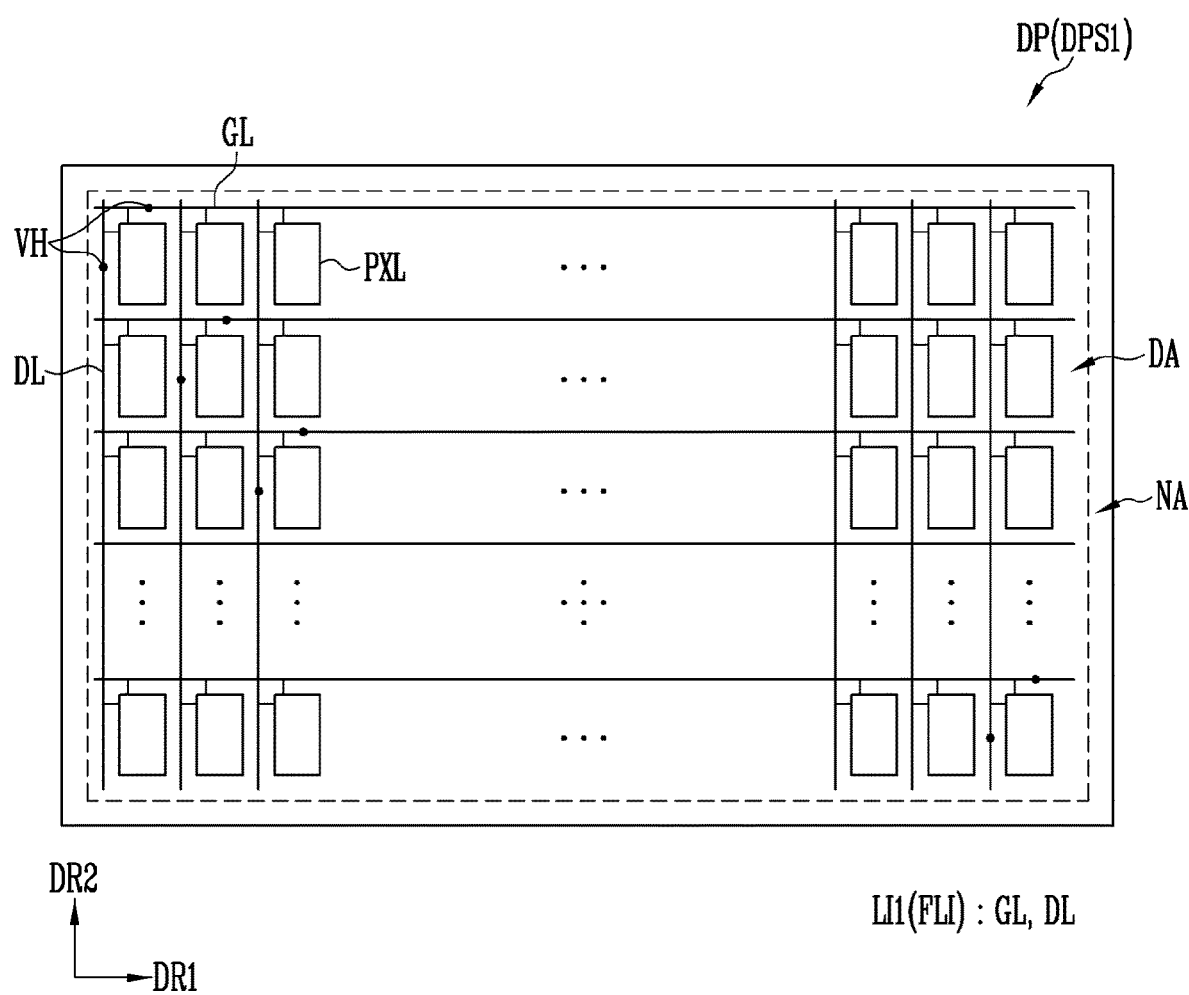
FIGS. 6A and 6B are plan views schematically illustrating a display panel according to an embodiment of the disclosure.
Figure 6B:
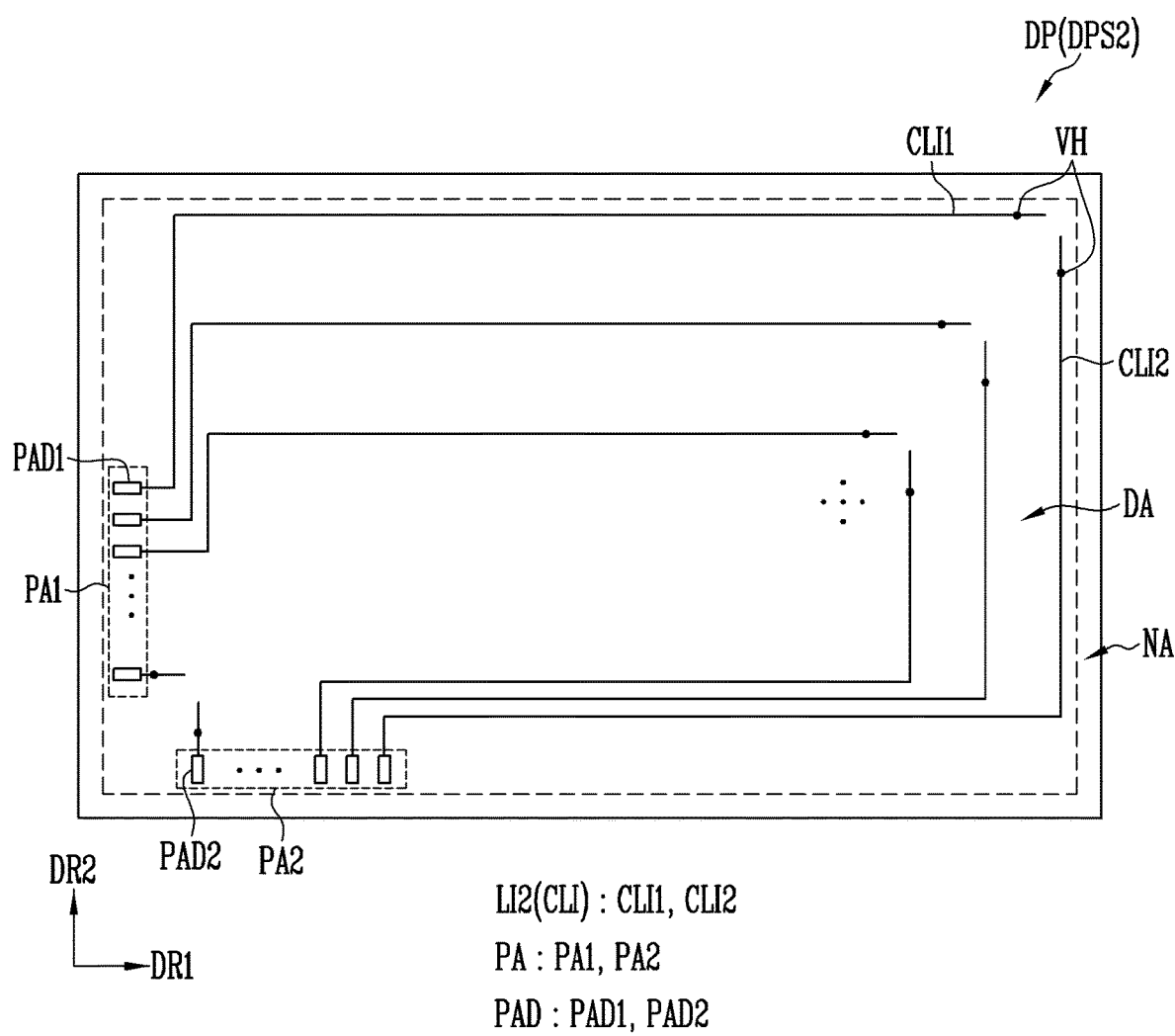

FIGS. 6A and 6B are plan views schematically illustrating the display panel DP according to an embodiment of the disclosure. For example, FIGS. 6A and 6B illustrate a first surface DPS1 and a second surface DPS2 of the display panel DP, respectively. The first surface DPS1 of the display panel DP may be a display surface on which an image may be displayed, and may include a display area DA in which the pixels PXL may be arranged. The second surface DPS2 of the display panel DP may be a non-display surface on which an image may not be displayed, and may face the first surface DPS1.

In describing the embodiments of the disclosure, the front surface of the display panel DP (or the display device DD) may refer to a surface (e.g., an upper surface) on which an image may be displayed, and the rear surface of the display panel DP (or the display device DD) may refer to a surface (e.g., a lower surface) located in a direction opposite to the surface on which an image may be displayed. For example, the first surface DPS1 and the second surface DPS2 of the display panel DP may be a front surface and a rear surface, respectively. In this case, the second surface DPS2 of the display panel DP may be covered by a case or the like.

FIGS. 6A and 6B illustrate that first lines LI1 and second lines LI2 respectively disposed on the first surface DPS1 and the second surface DPS2 of the display panel DP may have a lateral symmetrical shape in at least one area of the display panel DP (e.g., areas connected to each other through each via hole VH and a surrounding area thereof). This may be due to a difference in viewpoint when the display panel DP may be viewed from above and when the display panel DP may be viewed from below. For example, an area on the left side of the first surface DPS1 of the display panel DP in FIG. 6A may correspond to (for example, overlap) an area on the right side of the second surface DPS2 of the display panel DP in FIG. 6B.

First, referring to FIGS. 1 to 6A, the first surface DPS1 of the display panel DP may be one surface corresponding to the front surface (e.g., the upper surface) of the substrate SUB, and may include the pixels PXL and the first lines LI1 (also referred to as "front lines FLI") provided on the front surface of the substrate SUB. For example, the pixels PXL arranged according to a certain rule and the first lines LI1 connected to the pixels PXL may be formed on the front surface of the substrate SUB.

The first lines LI1 may collectively refer to lines provided on the first surface DPS1 of the display panel DP. For example, the first lines LI1 may include gate lines GL and data lines DL connected to the pixels PXL so as to drive the pixels PXL. The first lines LI1 may further include at least one power line and/or at least one signal line for supplying driving power and/or signals to the pixels PXL. For example, the first lines LI1 may further include a first power line and a second power line for supplying high-potential pixel power and low-potential pixel power to the pixels PXL, respectively.

Each of the gate lines GL may extend in the first direction DR1 and may be sequentially arranged in the second direction DR2. In an embodiment, the first direction DR1 may be a row direction (or a horizontal direction), and the second direction DR2 may be a column direction (or a vertical direction), but the disclosure is not limited thereto.

The gate lines GL may include scan lines connected to the pixels PXL of each pixel row (horizontal line). The gate lines GL may optionally further include other control lines (e.g., sensing signal lines) for controlling the operations of the pixels PXL.

The data lines DL may extend in a direction different from that of the gate lines GL in the display area DA, and may intersect with the gate lines GL. For example, the data lines DL may extend in the second direction DR2, and may be sequentially arranged in the first direction DR1. The data lines DL may be connected to the pixels PXL of each pixel column (vertical line).

The extending direction and/or the arrangement structure of the gate lines GL and the data lines DL are not particularly limited, and this may be variously changed according to embodiments. For example, the extending/arranging directions of the gate lines GL and the data lines DL may be changed in reverse, or at least one of the gate lines GL and the data lines DL may be formed in a mesh structure.

According to an embodiment, the first lines LI1 may further include other signal lines disposed substantially parallel to the data lines DL. For example, the first lines LI1 may further include sensing lines that extend in the second direction DR2, like the data lines DL, and may be sequentially arranged in the first direction DR1.

At least one via hole VH may be formed in each of the first lines LI1. For example, at least one via hole VH may be formed in each of the gate lines GL and each of the data lines DL.

The via holes VH may be formed to expose the first lines LI1 in an area overlapping each of the first lines LI1. For example, each of the via holes VH (also referred to as a "through hole") may be formed to penetrate through at least the substrate SUB. The first lines LI1 may be connected to the second lines LI2 formed on the second surface DPS2 of the display panel DP through the via holes VH.

The number of via holes VH formed in the first lines LI1 may be equal to or different from each other. For example, K via holes (VH) (K may be a natural number) may be formed in each gate line GL, and J via holes VH (J may be a natural number) may be formed in each data line DL. Furthermore, the number of via holes VH formed in each gate line GL and the number of via holes VH formed in each data line DL may be equal to or different from each other.

In an embodiment, the via holes VH may be uniformly distributed in the display area DA. In this case, physical impact due to the formation of the via holes VH in the substrate SUB or the like may be dispersed or relieved, and the mechanical strength of the display panel DP may be improved. In addition, in case that at least some via holes VH are disposed in the display area DA, the non-display area NA of the display device DD may be minimized on the display surface of the display panel DP, for example, the first surface DPS1.

However, the location and/or arrangement structure of the via holes VH may be variously changed according to embodiments. For example, in another embodiment, the via holes VH may be densely or irregularly disposed in an area of the display area DA and/or the non-display area NA.

Referring to FIGS. 1 to 6B, the second surface DPS2 of the display panel DP may be a surface corresponding to the rear surface (e.g., the lower surface) of the substrate SUB, and may include second lines LI2 (also referred to as "connection lines CLI") disposed on the rear surface of the substrate SUB, and pads PAD connected to the second lines LI2.

In an embodiment, the pads PAD may be formed to overlap the second lines LI2 in a pad area PA, but the disclosure is not limited thereto. For example, in another embodiment, the pads PAD may be integrally formed with the second lines LI2. In this case, the second lines LI2 may be exposed in the pad area PA and connected to the driving circuit (or the circuit board) through the exposed area.

The second lines LI2 may be formed and/or disposed to correspond to the first lines LI1 disposed on the front surface of the substrate SUB. For example, at least one area of each of the second lines LI2 may be formed at a position corresponding to one first line LI1 and connected to the first line LI1.

The second lines LI2 may include lines provided on the second surface DPS2 of the display panel DP. For example, the second lines LI2 may include first connection lines CLI1 connected to each gate line GL, and second connection lines CLI2 connected to each data line DL. In addition, the second lines LI2 may further include at least one connection line connected to at least one power line and/or signal line provided on the first surface DPS1 of the display panel DP. For example, the second lines LI2 may further include a third connection line connected to the first power line, and a fourth connection line connected to the second power line.

Each of the second lines LI2 may be integrally or non-integrally connected to at least one pad PAD. For example, each of the first connection lines CLI1 may be connected to at least one first pad PAD1 located in the first pad area PA1, and each of the second connection lines CLI2 may be connected to at least one second pad PAD2 located in the second pad area PA2.

In an embodiment, one or more first pad areas PA1 and second pad areas PA2 may be provided on the second surface DPS2 of the display panel DP, and the positions are not particularly limited. For example, the first pad areas PA1 and/or the second pad areas PA2 may be disposed in the display area DA (or may overlap the display area DA). In this case, the driving circuit (or the circuit board) for supplying the driving signal to the display panel DP may be disposed to overlap the display area DA.

However, the disclosure is not limited thereto. For example, in another embodiment, the first pad area PA1 and/or the second pad area PA2 may be disposed in the non-display area NA. In addition, the first pad area PA1 and the second pad area PA2 may or may not be disposed adjacent to each other. For example, the position of the pad area PA and/or the arrangement structure of the pads PAD may be variously changed according to embodiments.

The pads PAD may be connected to a driving circuit (e.g., a gate driving unit, a data driving unit, or a power supply unit). For example, the pads PAD may be connected to the circuit board in the pad area PA, and may be connected to the driving circuits through the circuit board. Therefore, the first lines LI1 formed on the first surface DPS1 of the display panel DP may be connected to the second lines and the pads PAD formed on the second surface DPS2 of the display panel DP.

According to the above-described embodiments, the first lines LI1 formed on the front surface of the substrate SUB may be connected to the second lines LI2 formed on the rear surface of the substrate SUB through the via holes VH penetrating through the substrate SUB. The second lines LI2 may be connected to the driving circuit through pads PAD provided in the pad area PA. Therefore, the first lines LI1 may be respectively connected to the driving circuits.

In the above-described embodiments, the pad area PA and/or at least one connection film or circuit board connected thereto (e.g., a flexible circuit board) may be provided on the rear surface of the substrate SUB to overlap the display area DA. In this case, when viewed from the first surface DPS1 of the display panel DP, the non-display area NA of the display device DD may be substantially removed or reduced.

In case that the multi-screen display device TDD may be configured using the display devices DD in which the non-display area NA may be minimized in this manner, the seam area that may be formed between the display devices DD may be reduced or removed, and an image that naturally continues even in the boundary area between the display devices DD may be displayed. Therefore, it may be possible to easily fabricate multi-screen display devices TDD having various sizes.

Figure 7A:
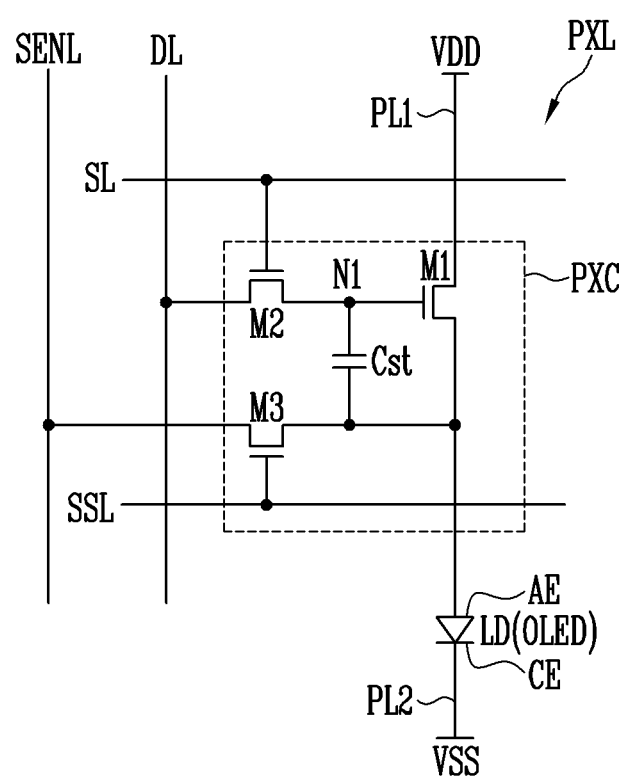
FIGS. 7A and 7B are circuit diagrams schematically illustrating pixels according to embodiments of the disclosure.
Figure 7B:
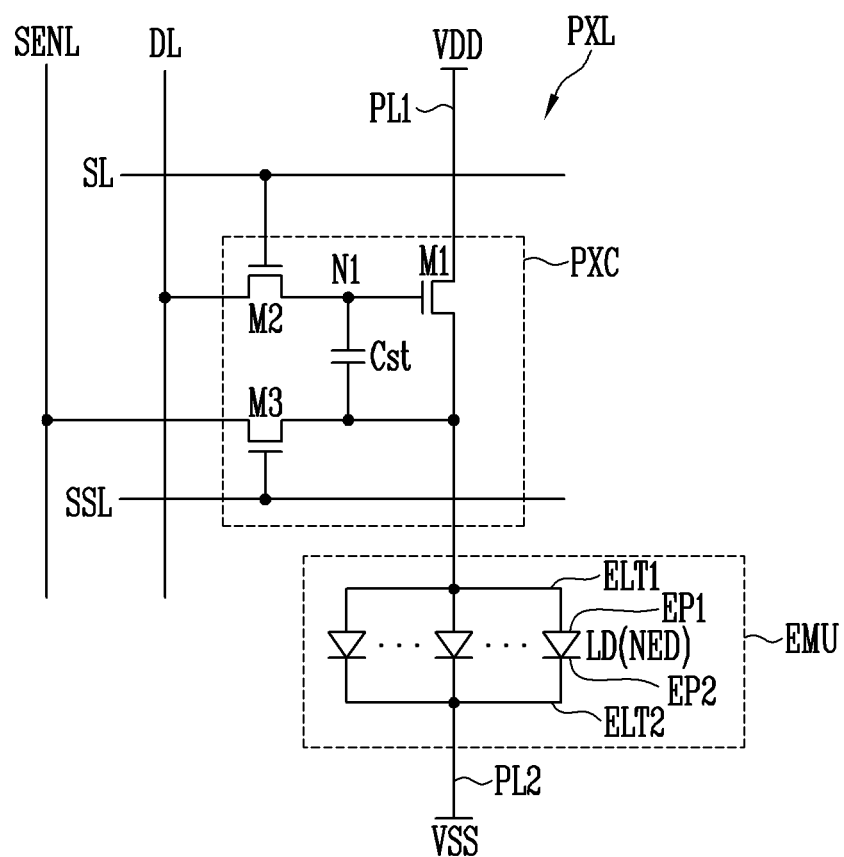

FIGS. 7A and 7B are circuit diagrams schematically illustrating pixels PXL according to embodiments of the disclosure. For example, FIGS. 7A and 7B illustrate different embodiments of the pixel PXL including at least one light emitting element LD, respectively. As an example, FIG. 7A illustrates an embodiment of a pixel PXL including an organic light emitting diode OLED as a light emitting element LD, and FIG. 7B illustrates an embodiment of a pixel PXL including multiple inorganic light emitting diodes NED as a light emitting element LD. However, a structure of a pixel PXL and a light source for configuring the pixel PXL may be variously changed according to the type of the display device DD.

First, referring to FIG. 7A, the pixel PXL may include an organic light emitting diode OLED connected between a first power supply voltage VDD and a second power supply voltage VSS, and may optionally further include a pixel circuit PXC for driving the organic light emitting diode OLED.

The pixel circuit PXC may be connected between the first power supply voltage VDD and the organic light emitting diode OLED. In addition, the pixel circuit PXC may be connected to the scan line SL and the data line DL of the pixel PXL to control the operation of the organic light emitting diode OLED in response to a scan signal and a data signal supplied from the scan line SL and the data line DL. In addition, the pixel circuit PXC may be optionally further connected to a sensing signal line SSL and a sensing line SENL.

In describing the embodiments of the disclosure, the term "connection (or coupling)" may comprehensively mean a physical and/or electrical connection (or coupling). In addition, the term "connection (or coupling)" may comprehensively mean a direct or indirect connection (or coupling), and an integrated or non-integrated connection (or coupling).

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power supply voltage VDD and a first electrode AE (e.g., an anode electrode) of the organic light emitting diode OLED. A gate electrode of the first transistor M1 may be connected to a first node N1. The first transistor M1 may control a driving current supplied to the organic light emitting diode OLED in response to the voltage of the first node N1. For example, the first transistor M1 may be a driving transistor for controlling the driving current of the pixel PXL.

The second transistor M2 may be connected between the data line DL and the first node N1. A gate electrode of the second transistor M2 may be connected to the scan line SL. The second transistor M2 may be turned on when a scan signal of a gate-on voltage (e.g., a high level voltage) may be supplied from the scan line SL, and connects the data line DL to the first node N1.

A data signal of a corresponding frame may be supplied to the data line DL during each frame period, and the data signal may be transmitted to the first node N1 through the second transistor M2 turned on during a period in which the scan signal of the gate-on voltage may be supplied. For example, the second transistor M2 may be a switching transistor for transmitting each data signal to the pixel PXL.

An electrode of the storage capacitor Cst may be connected to the first node N1, and the other electrode may be connected to the second electrode of the first transistor M1. The storage capacitor Cst may charge a voltage corresponding to the data signal supplied to the first node N1 during each frame period.

The third transistor M3 may be connected between the first electrode AE of the organic light emitting diode OLED (or the second electrode of the first transistor M1) and the sensing line SENL. A gate electrode of the third transistor M3 may be connected to the sensing signal line SSL. The third transistor M3 may transmit, to the sensing line SENL, a voltage value applied to the first electrode AE of the organic light emitting diode OLED according to a sensing signal supplied to the sensing signal line SSL during a sensing period. A voltage value transmitted through the sensing line SENL may be provided to an external circuit (e.g., a timing controller), and the external circuit may extract characteristic information (e.g., a threshold voltage of the first transistor M1, etc.) of each pixel PXL based on the provided voltage value. The extracted characteristic information may be used to convert image data so that characteristic deviations between the pixels PXL may be compensated.

Although FIG. 7A illustrates that the transistors included in the pixel circuit PXC, for example, the first, second, and third transistors M1, M2, and M3, may be all N-type transistors, the disclosure is not limited thereto. For example, at least one of the first, second, and third transistors M1, M2, and M3 may be changed to a P-type transistor. For example, the pixel circuit PXC may include a combination of P-type and N-type transistors.

In addition, the structure and driving method of the pixel PXL may be variously changed. For example, the pixel circuit PXC may include pixel circuits of various structures and/or driving methods, in addition to an embodiment illustrated in FIG. 7A.

For example, the pixel circuit PXC may not include the third transistor M3. In addition, the pixel circuit PXC may further include other circuit elements such as a compensation transistor for compensating the threshold voltage of the first transistor M1, etc., an initialization transistor for initializing the voltage of the first node N1 or the first electrode AE of the organic light emitting diode OLED, an emission control transistor for controlling a period in which the driving current may be supplied to the organic light emitting diode OLED, and/or a boosting capacitor for boosting the voltage of the first node N1.

In another embodiment, in case that the pixel PXL may be a pixel of a passive light emitting display device, the pixel circuit PXC may be omitted. In this case, the first electrode AE and the second electrode CE of the organic light emitting diode OLED may be connected to (e.g., directly connected to) the scan line SL, the data line DL, the first power line PL1, and the second power line PL2, and/or other signal lines or power lines.

The organic light emitting diode OLED may include a first electrode AE connected to the first power supply voltage VDD through the pixel circuit PXC and the first power line PL1, and a second electrode CE connected to second power supply voltage VSS through the second power line PL2. In addition, the organic light emitting diode OLED may include an organic light emission layer between the first electrode AE and the second electrode CE.

The first power supply voltage VDD and the second power supply voltage VSS may have different potentials so that the organic light emitting diode OLED may emit light. As an example, the first power supply voltage VDD may be set as a high potential voltage, and the second power supply voltage VSS may be set as a low potential voltage. In this case, the first electrode AE of the organic light emitting diode OLED may be an anode electrode, and the second electrode CE of the organic light emitting diode OLED may be a cathode electrode.

In case that the driving current is supplied from the pixel circuit PXC, the organic light emitting diode OLED may generate light having a luminance corresponding to the driving current. Therefore, each pixel PXL may emit light having a luminance corresponding to the data signal supplied to the first node N1 during each frame period. In case that a data signal corresponding to a black gray scale is supplied to the first node N1 during the frame period, the pixel circuit PXC may not supply the driving current to the organic light emitting diode OLED, and thus, the pixel PXL may maintain a non-emission state during the frame period.

Referring to FIG. 7B, the pixel PXL may include a light emission unit EMU including at least one inorganic light emitting diode NED connected between the first power supply voltage VDD and the second power supply voltage VSS. As an example, the light emission unit EMU may include multiple nano/micro-scale inorganic light emitting diodes NED connected in parallel to each other between the pixel circuit PXC and the second power supply voltage VSS.

For example, the light emission unit EMU may include a first electrode ELT1 (also referred to as a "first pixel electrode" or a "first alignment electrode") connected to the first power supply voltage VDD through the pixel circuit PXC and the first power line PL1, a second electrode ELT2 (also referred to as a "second pixel electrode" or a "second alignment electrode") connected to the second power supply voltage VSS through the second power line PL2, and multiple inorganic light emitting diodes NED connected between the first and second electrodes ELT1 and ELT2. According to an embodiment, the first electrode ELT1 of the light emission unit EMU may be an anode electrode, and the second electrode ELT2 of the light emission unit EMU may be a cathode electrode, but the disclosure is not limited thereto.

In an embodiment, the light emission unit EMU may include multiple inorganic light emitting diodes NED connected in parallel in the same direction between the first electrode ELT1 and the second electrode ELT2. For example, each of the inorganic light emitting diodes NED may include a first end portion EP1 (e.g., a P-type end portion) connected to the first power supply voltage VDD through the first electrode ELT1 and/or the pixel circuit PXC, and a second end portion EP2 (e.g., an N-type end portion) connected to the second power supply voltage VSS through the second electrode ELT2. For example, the inorganic light emitting diodes LD may be connected in parallel in the forward direction between the first and second electrodes ELT1 and ELT2.

Although FIG. 7B illustrates an embodiment in which the pixel PXL includes the light emission unit EMU having a parallel structure, the disclosure is not limited thereto. For example, the pixel PXL may include a light emission unit EMU having a series structure or a series-parallel structure. In this case, the light emission unit EMU may include inorganic light emitting diodes NED connected in a series structure or a series-parallel structure between the first electrode ELT1 and the second electrode ELT2.

In an embodiment, each of the inorganic light emitting diodes NED may be a nano/micro-scale inorganic light emitting diode having a rod-shaped or core-shell structure including a nitride-based semiconductor. In another embodiment, each of the inorganic light emitting diodes NED may be an inorganic light emitting diode having a flip chip structure. In addition, the type, structure, shape, and/or size of the inorganic light emitting diode NED may be changed according to embodiments.

FIGS. 8A to 8D are cross-sectional views illustrating display devices DD according to embodiments of the disclosure, respectively. According to an embodiment consistent with FIG. 7A, FIGS. 8A to 8D illustrate a cross-section of a display panel DP, centering on an area of a pixel PXL including an organic light emitting diode OLED (e.g., a portion of a pixel area PXA in which the pixel PXL may be formed), and a connection area CNA and a pad area PA in which one via hole VH and a pad PAD may be formed. However, as illustrated in FIGS. 6A and 6B, the display device DD may include multiple pixels PXL, via holes VH, and pads PAD.

In FIGS. 8A to 8D, a transistor M (e.g., the first electrode in FIGS. 7A and 7B) connected to a first electrode AE of an organic light emitting diode OLED through each contact hole CH and/or a bridge pattern BRP is illustrated as an example of circuit elements that may be disposed on a pixel circuit layer PCL, and a gate line GL that may be disposed in each pixel area PXA and/or a peripheral area thereof is illustrated as an example of a first line LI1 that may be disposed on a pixel circuit layer PCL.

In addition, in FIGS. 8A to 8D, a gate line GL is illustrated as a representative of the first line LI1, a first connection line CLI1 connected to the gate line GL is illustrated as a representative of a second line LI2, and a first pad PAD1 connected to one first connection line CLI1 is illustrated as a representative of a pad PAD.

However, the positions of the first lines LI1 on the plane/cross-section may be variously changed according to the design structure of the pixel circuit layer PCL for configuring the pixel circuit PXC. The first lines LI1 may be respectively connected to the second lines LI2 through the via holes VH penetrating through a substrate SUB, a first protective layer PRL1, and/or at least one insulating layer.

In addition, although each electrode and line are illustrated as a single layer in FIGS. 8A to 8D, this may be variously changed according to embodiments. For example, at least one electrode, the first line LI1, the second line LI2, and/or the pad PAD may be formed in multiple layers.

First, referring to FIGS. 1 to 8A, the display device DD may include a display panel DP, an upper protective layer (or, a front protective layer) UPL disposed (e.g., provided) on the front surface of the display panel DP (e.g., the first surface DPS1 in FIG. 6A), and a lower protective layer (or, a rear protective layer) RPL provided on the rear surface of the display panel DP (e.g., the second surface (DPS2) of FIG. 6B).

Figure 8A:
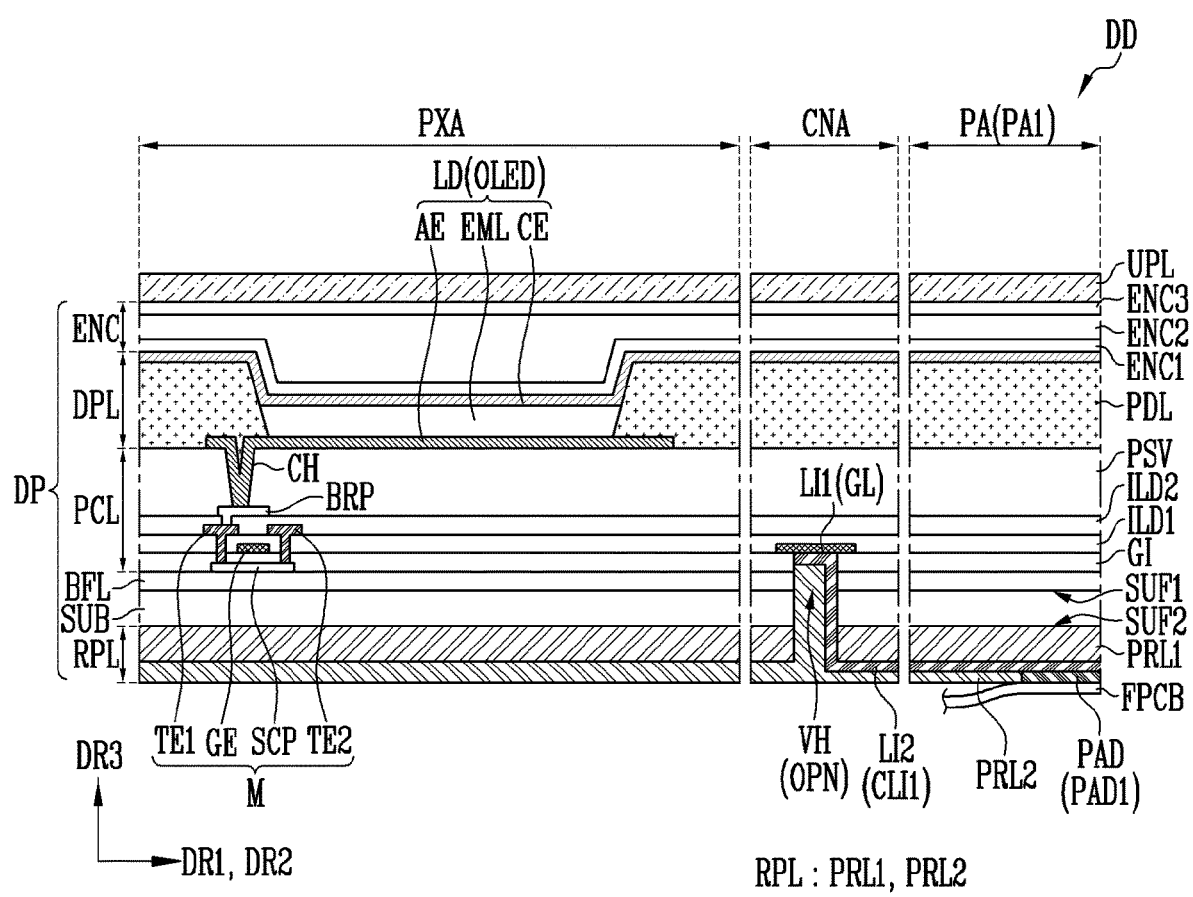
FIGS. 8A to 8D are cross-sectional views schematically illustrating display devices according to embodiments of the disclosure, respectively.

In FIG. 8A, the upper protective layer UPL is illustrated as a separate element from the display panel DP, but the disclosure is not limited thereto. For example, the upper protective layer UPL may be integrally provided or formed with the display panel DP. In this case, the display panel DP may be regarded as including the upper protective layer UPL.

The lower protective layer RPL may be formed on (e.g., directly formed on) the rear surface of the display panel DP through a coating method or the like. For example, the lower protective layer RPL may be formed on the second surface SUF2 of the substrate SUB through a liquid coating process and a photo lithography process. The second lines LI2 and the pads PAD may be formed on (e.g., directly formed on) the rear surface of the display panel DP on which the lower protective layer RPL (e.g., the first protective layer PRL1) may be formed. Therefore, in FIG. 8A, the lower protective layer RPL, the second lines LI2, and the pads PAD, which may be provided on the rear surface of the display panel DP, are also illustrated as elements of the display panel DP. However, the lower protective layer RPL, the second lines LI2, and/or the pads PAD may be regarded as separate elements from the display panel DP.

The display panel DP may include a substrate SUB including a first surface SUF1 (e.g., a front surface) and a second surface SUF2 (e.g., a rear surface), a buffer layer BFL, a pixel circuit layer PCL, a display element layer DPL, and an encapsulation layer ENC, which may be provided and/or formed on the first surface SUF1 of the substrate SUB, and a lower protective layer RPL, second lines LI2, and pads PAD, which may be provided and/or formed on the second surface SUF2 of the substrate SUB. In an embodiment, the pixel circuit layer PCL, the display element layer DPL, and the encapsulation layer ENC may be sequentially formed on the first surface SUF1 of the substrate SUB on which the buffer layer BFL may be optionally provided, but the disclosure is not limited thereto. In addition, in order to connect the first lines LI1 to the corresponding second lines LI2, the display panel DP may further include via holes VH penetrating through the substrate SUB, the buffer layer BFL, and/or the at least one insulating layer.

The buffer layer BFL may be provided on the first surface SUF1 of the substrate SUB, and may be opened in an area corresponding to the via holes VH. The buffer layer BFL may include a single layer or multiple layers.

The buffer layer BFL may include an inorganic film of at least one layer. For example, the buffer layer BFL may include a single-layer inorganic film or multilayer inorganic films. In an embodiment, the buffer layer BFL may include at least one material selected from silicon nitride ($SiN_x$), silicon oxide ($SiO_x$), and silicon nitride ($SiO_xN_y$), but the disclosure is not limited thereto. For example, the buffer layer BFL may include various inorganic materials, and a material for forming the buffer layer BFL is not particularly limited.

The buffer layer BFL may improve adhesive strength between the substrate SUB and the pixel circuit layer PCL, and may prevent diffusion of impurities into the pixel circuit layer PCL thereon.

A pixel circuit layer PCL may be disposed on the buffer layer BFL.

The pixel circuit layer PCL may include circuit elements constituting the pixel circuit PXC of each of the pixels PXL, and first lines LI1 connected to the pixel circuits PXC of the pixels PXL and/or the light emitting elements LD. For example, the pixel circuit layer PCL may include circuit elements constituting the pixel circuit PXC of each of the pixels PXL, and gate lines GL, data lines DL, a first power line PL1, and a second power line PL2 connected to the circuit elements.

In addition, the pixel circuit layer PCL may include multiple insulating layers in addition to the circuit elements and the first lines LI1. For example, the pixel circuit layer PCL may include a gate insulating layer GI, a first interlayer insulating layer ILD1, a second interlayer insulating layer ILD2, and/or a passivation layer PSV, which may be sequentially disposed on the buffer layer BFL.

According to an embodiment, a semiconductor layer may be disposed on the buffer layer BFL. The semiconductor layer may include a semiconductor pattern SCP of each transistor M. The semiconductor pattern SCP may include a channel region overlapping each gate electrode GE, and first and second conductive regions (e.g., source and drain regions) disposed on both sides of the channel region.

A gate insulating layer GI may be disposed on the semiconductor layer. A first conductive layer may be disposed on the gate insulating layer GI.

The first conductive layer may include a gate electrode GE of each transistor M. In addition, the first conductive layer may further include an electrode of the storage capacitor Cst and/or at least one first line LI1 (e.g., gate lines GL and/or sensing signal lines SSL).

A first interlayer insulating layer ILD1 may be disposed on the first conductive layer. A second conductive layer may be disposed on the first interlayer insulating layer ILD1.

The second conductive layer may include first and second transistor electrodes TE1 and TE2 of each transistor M. The first and second transistor electrodes TE1 and TE2 may be source and drain electrodes. In addition, the second conductive layer may further include one electrode of the storage capacitor Cst and/or at least one first line LI1 (e.g., data lines DL).

A second interlayer insulating layer ILD2 may be disposed on the second conductive layer. A third conductive layer may be disposed on the second interlayer insulating layer ILD2.

The third conductive layer may include a bridge pattern BRP and/or at least one first line LI1 (e.g., first and second power lines PL1 and PL2 and/or sensing lines SENL) for connecting the pixel circuit layer PCL and the display element layer DPL. The bridge pattern BRP may be connected to the first electrodes AE and ELT1 of the light emitting element LD (e.g., the organic light emitting diode OLED or at least one nano/micro-scale inorganic light emitting diode NED) of each pixel PXL through a contact hole CH or the like.

A passivation layer PSV may be disposed on the third conductive layer. The display element layer DPL may be disposed on the pixel circuit layer PCL including the passivation layer PSV.

The display element layer DPL may include light emitting elements LD of the pixels PXL and/or electrodes connected thereto. For example, an organic light emitting diode OLED or multiple nano/micro-scale inorganic light emitting diodes NED may be disposed in each pixel area of the display element layer DPL.

In case that the light emitting element LD of the pixel PXL is an organic light emitting diode OLED as in an embodiment of FIG. 7A, the display element layer DPL may include an organic light emitting diode OLED formed in each pixel area PXA as illustrated in FIG. 8A. In this case, the light emitting element LD may include first and second electrodes AE and CE of the organic light emitting diode OLED, and a light emission layer EML disposed between the first and second electrodes AE and CE.

One of the first and second electrodes AE and CE may be an anode electrode, and the other thereof may be a cathode electrode. When the light emitting element LD is a top emission type organic light emitting diode (OLED), the first electrode AE may be a reflective electrode, and the second electrode CE may be a transmissive electrode. In an embodiment of the disclosure, a case in which the light emitting element LD is a top emission type organic light emitting diode (OLED) and the first electrode AE is an anode electrode will be described as an example.

The first electrode AE may be connected to a circuit element (e.g., the first transistor M1 of FIG. 7A) of the pixel circuit layer PCL through a bridge pattern BRP and/or a contact hole CH penetrating through the passivation layer PSV. The first electrode AE may include a reflective layer (not illustrated) capable of reflecting light or a transparent conductive layer (not illustrated) disposed above or below the reflective layer. For example, the first electrode AE may include multilayer conductive films including a lower transparent conductive film and an upper transparent conductive film including indium tin oxide (ITO), and a reflective film provided between the lower transparent conductive film and the upper transparent conductive film and including silver (Ag).

The display element layer DPL may further include a pixel defining layer PDL having an opening exposing a portion of the first electrode AE, for example, an upper surface of the first electrode AE. The pixel defining layer PDL may be an organic insulating film including an organic material. For example, the pixel defining layer PDL may include an organic insulating layer such as an acrylic resin, an epoxy resin, a phenolic resin, a polyamide resin, and a polyimide resin.

The light emission layer EML may be disposed in an area corresponding to the opening of the pixel defining layer PDL. For example, the light emission layer EML may be disposed on one surface of the exposed first electrode AE. The light emission layer EML may have a multilayer thin-film structure including at least a light generation layer. The light emission layer EML may include a hole injection layer that injects holes, a hole transport layer that has excellent hole transportability and increases the chance of recombination between holes and electrons by suppressing the movement of electrons that could not be bonded in the light generation layer, a light generation layer that emits light by recombination of injected electrons and holes, a hole blocking layer that suppresses the movement of holes that could not be recombined in the light generation layer, and an electron transport layer that smoothly transports electrons to the light generation layer, and an electron injection layer that injects electrons.

The light generation layer may be formed individually in the emission area of each pixel PXL, and the hole injection layer, the hole transport layer, the hole blocking layer, the electron transport layer, and the electron injection layer may be a common layer connected in emission areas adjacent to each other. However, in FIG. 8A, the light emission layer EML is illustrated based on the light generation layer.

A second electrode CE may be provided and/or formed on the light emission layer EML. The second electrode CE may be a common layer commonly provided to the pixels PXL, but the disclosure is not limited thereto. The second electrode CE may be a transmissive electrode and may include a transparent conductive material. The transparent conductive material may include at least one of a transparent conductive oxide, such as indium tin oxide (ITO), indium zinc oxide (IZO), zinc oxide (ZnO), or indium tin zinc oxide (ITZO), and a conductive polymer such as PEDOT, but the disclosure is not limited thereto.

An encapsulation layer ENC may be provided and/or formed on the display element layer DPL including the light emitting elements LD of the pixels PXL.

The encapsulation layer ENC may include a single-layer film or a multilayer film. In an embodiment, the encapsulation layer ENC may include multiple insulating layers overlapping (e.g., covering) the display element layer DPL. For example, the encapsulation layer ENC may include an inorganic film of at least one layer and an organic film of at least one layer.

In an embodiment, the encapsulation layer ENC may include first, second, and third encapsulation layers ENC1, ENC2, and ENC3. The first encapsulation layer ENC1 may be disposed on the display element layer DPL. The second encapsulation layer ENC2 may be disposed on the first encapsulation layer ENC1. The third encapsulation layer ENC3 may be disposed on the second encapsulation layer ENC2. In an embodiment, the first and third encapsulation layers ENC1 and ENC3 may include an inorganic film including an inorganic material, and the second encapsulation layer ENC2 may include an organic film including an organic material.

The lower protective layer RPL may include a first protective layer PRL1 and a second protective layer PRL2.

The first protective layer PRL1 may be provided on the second surface SUF2 of the substrate SUB, and may overlap the pixels PXL and the first lines LI1. For example, the first protective layer PRL1 may completely cover the second surface SUF2 of the substrate SUB, but may include multiple openings OPN that may be locally opened corresponding to the via holes VH.

In an embodiment of the disclosure, the first protective layer PRL1 may include a photo-sensitive material. For example, the first protective layer PRL1 may include an organic photoresist (PR) material that may be etched in a positive or negative manner, and may include a single layer or multiple layers.

In an embodiment, the first protective layer PRL1 may be formed by coating at least one type of photoresist material on the second surface SUF2 of the substrate SUB through a liquid coating process and then performing thermal curing and/or photo curing. In addition, the first protective layer PRL1 may be patterned to include openings OPN corresponding to each via hole VH, and the via holes VH may be formed by etching the substrate SUB or the like using the patterned first protective layer PRL1 as a mask. The openings OPN of the first protective layer PRL1 may be formed to communicate with the via holes VH. In this case, the openings OPN of the first protective layer PRL1 may be integrally formed with the via holes VH. Therefore, the openings OPN of the first protective layer PRL1 may be regarded as an area of the via holes VH.

In an embodiment, the first protective layer PRL1 may include a photoresist material that may be cured at about 100° C. or lower. In this case, it may be possible to prevent elements, which may be susceptible to heat damage, such as the organic light emitting diode OLED, from being damaged by heat applied during the process of forming the first protective layer PRL1. Therefore, defects of the display device DD may be prevented and reliability thereof may be secured.

For example, the first protective layer PRL1 may be formed using a low-temperature thermosetting type organic photoresist material that may be cured at about 100° C. or lower. Examples of the photoresist material that may be used to form the first protective layer PRL1 may include an epoxy-based, acrylic, or urethane-based photoresist material, but the disclosure is not limited thereto.

In case that the light emitting element LD is a relatively heat resistant element such as an inorganic light emitting diode NED, the selection of the photoresist material that may be used to form the first protective layer PRL1 may be wider. For example, the first protective layer PRL1 may be formed using a photoresist material that may be cured at about 100° C. or higher.

The second protective layer PRL2 may be provided on the second surface SUF2 of the substrate SUB so as to overlap the first protective layer PRL1 and the second lines LI2, and may constitute the lower protective layer RPL together with the first protective layer PRL1. For example, the second protective layer PRL2 may be formed to cover the first protective layer PRL1, the via holes VH, and the second lines LI2 on the second surface SUF2 of the substrate SUB on which the first protective layer PRL1, the via holes VH, the second lines LI2, and the pads PAD may be formed.

In an embodiment, the second protective layer PRL2 may be provided to expose the pads PAD and planarize the upper portion of the second surface SUF2 of the substrate SUB. To this end, the second protective layer PRL2 may cover the first protective layer PRL1, the via holes VH, and the second lines LI2, and the surface of the second protective layer PRL2 may be provided at substantially the same height as that of the surfaces of the pads PAD. For example, the surfaces of the second protective layer PRL2 and the pads PAD may be positioned at the same height (or distance) from the second surface SUF2 of the substrate SUB.

In an embodiment, the second protective layer PRL2 may include a photo-sensitive material. For example, the second protective layer PRL2 may include a photoresist material identical to or different from that of the first protective layer PRL1, and may include a single layer or multiple layers.

In an embodiment, the second protective layer PRL2 may include a photoresist material that may be cured at about 100° C. or lower. In this case, it may be possible to prevent elements, which may be susceptible to heat damage, such as the organic light emitting diode OLED, from being damaged by heat applied during the process of forming the second protective layer PRL2.

For example, the second protective layer PRL2 may be formed using a low-temperature thermosetting type organic photoresist material that may be cured at about 100° C. or lower. Examples of the photoresist material that may be used to form the second protective layer PRL2 may include an epoxy-based, acrylic, or urethane-based photoresist material, but the disclosure is not limited thereto.

Meanwhile, in case that the light emitting element LD is a relatively heat resistant element such as an inorganic light emitting diode NED, the selection of the photoresist material that may be used to form the second protective layer PRL2 may be wider. For example, the second protective layer PRL2 may be formed using a photoresist material that may be cured at about 100° C. or higher.

In an embodiment, the first protective layer PRL1, the second protective layer PRL2, and/or the lower protective layer RPL including the same may have a thickness in a range set considering various conditions such as impact resistance, thickness of the display panel DP, and/or flexibility. For example, the first protective layer PRL1 and/or the second protective layer PRL2 may have a thickness in the range of about 10 μm to about 200 μm, and the lower protective layer RPL may have a thickness in a range of about 20 μm to about 200 μm. In an embodiment of the disclosure, the first protective layer PRL1 and/or the second protective layer PRL2 may be formed through a coating process. Therefore, in order to minimize the thickness of the display panel DP, each of the first protective layer PRL1 and/or the second protective layer PRL2 may be formed to have a minimum thickness (e.g., a thickness of about 10 μm or a thickness similar thereto).

In addition, in an embodiment of the disclosure, instead of attaching a separate lower protective film to the rear surface of the display panel DP, the first protective layer PRL1 and/or the second protective layer PRL2 may be used as the lower protective layer RPL. To this end, the first protective layer PRL1, the second protective layer PRL2, and/or the lower protective layer RPL may be formed to satisfy a certain range of modulus conditions considering factors such as impact resistance and/or thickness of the display device DD (in particular, the display panel DP). For example, each of the first protective layer PRL1 and/or the second protective layer PRL2, or the lower protective layer RPL including the same may be formed to have a modulus in the range of about 1 MPa to about 5 GPa.

The via holes VH may penetrate through at least the substrate SUB and the first protective layer PRL1 so as to expose an area (a portion) of each of the first lines LI1. For example, the via holes VH may be formed on the substrate SUB, the first protective layer PRL1, and the pixel circuit layer PCL so as to penetrate through the substrate SUB, the first protective layer PRL1, and at least one insulating layer (e.g., the buffer layer BFL, the gate insulating layer GI, the first interlayer insulating layer ILD1, and/or the second interlayer insulating layer ILD2.

The second lines LI2 may be provided on one surface of the first protective layer PRL1. The second lines LI2 may be respectively connected to the first lines LI1 through the via holes VH.

The pads PAD may be provided on a surface of the first protective layer PRL1. The pads PAD may be respectively connected to the second lines LI2. For example, the pads PAD may be formed to contact (e.g., directly contact) the second lines LI2 in each pad area PA, respectively. In an embodiment, the pads PAD may be connected to a circuit board FPCB (e.g., a flexible circuit board) on which a driving circuit may be mounted (or connected to a driving circuit). For example, the display device DD may include at least one circuit board FPCB provided on the second surface SUF2 of the substrate SUB so as to be connected to the pads PAD. In another embodiment, the driving circuit may be mounted (e.g., directly mounted) or formed on the pads PAD.

The upper protective layer UPL (also referred to as a "third protective layer") may be provided on the first surface SUF1 of the substrate SUB in which the pixels PXL may be formed, so as to overlap the pixels PXL and the first lines LI1. In an embodiment, the upper protective layer UPL may be an upper protective film that may be fabricated separately from the display panel DP and may be attached and/or provided on the front surface of the display panel DP, but the disclosure is not limited thereto. In addition, the upper protective layer UPL may be a window film integrally fabricated with a window WD, or a functional film integrally fabricated with various optical layers/functional layers such as a polarization layer POL, but the disclosure is not limited thereto.

Meanwhile, although FIG. 8A illustrates an embodiment in which a pixel area PXA, a connection area CNA, and a pad area PA do not overlap each other, the disclosure is not limited thereto. For example, as in embodiments of FIGS. 8B to 8D, at least one via hole VH and/or at least one pad PAD may be disposed in the pixel area PXA of the pixel PXL so as to overlap the at least one pixel PXL.

Figure 8B:
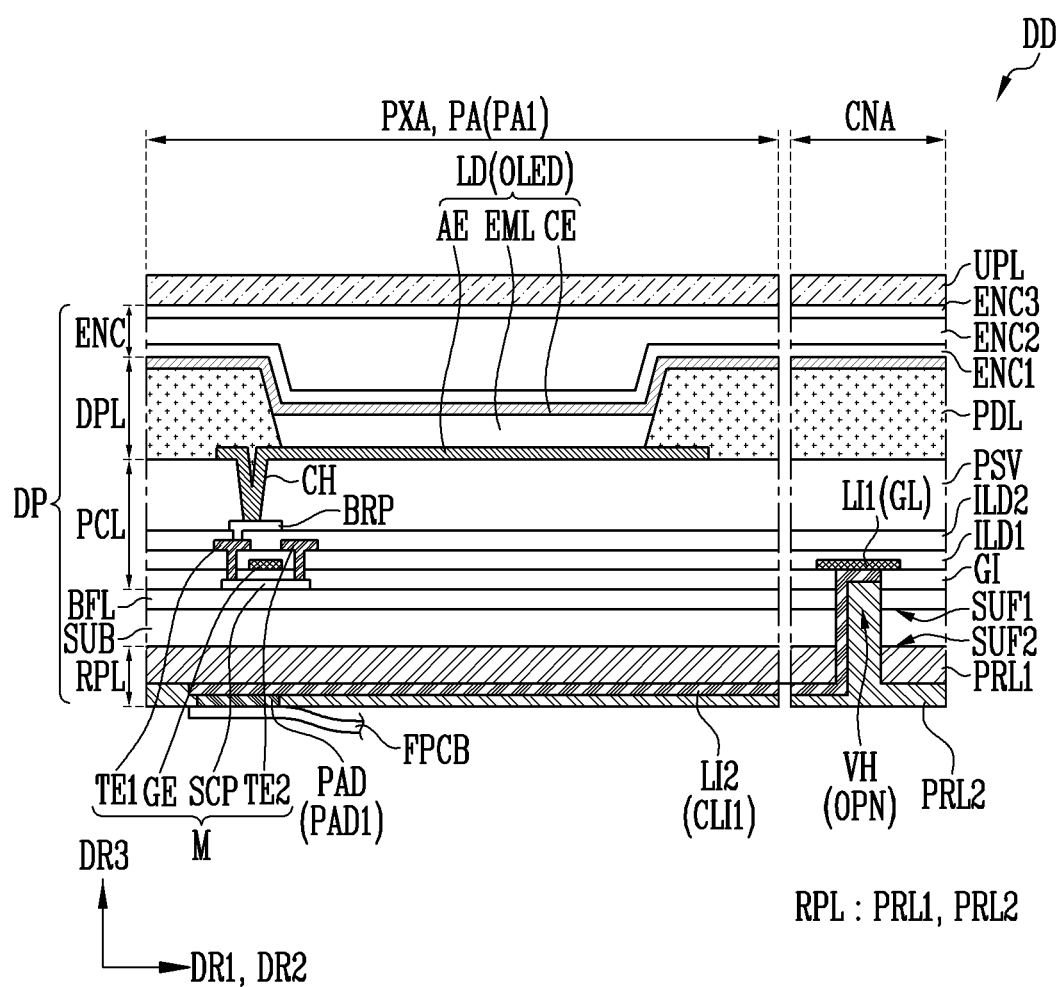

Referring to FIG. 8B, the pad area PA may overlap at least one pixel area PXA. As an example, at least one pad PAD may be provided on the second surface SUF2 of the substrate SUB so as to overlap the circuit element and/or the light emitting element LD constituting at least one pixel PXL.

Figure 8C:
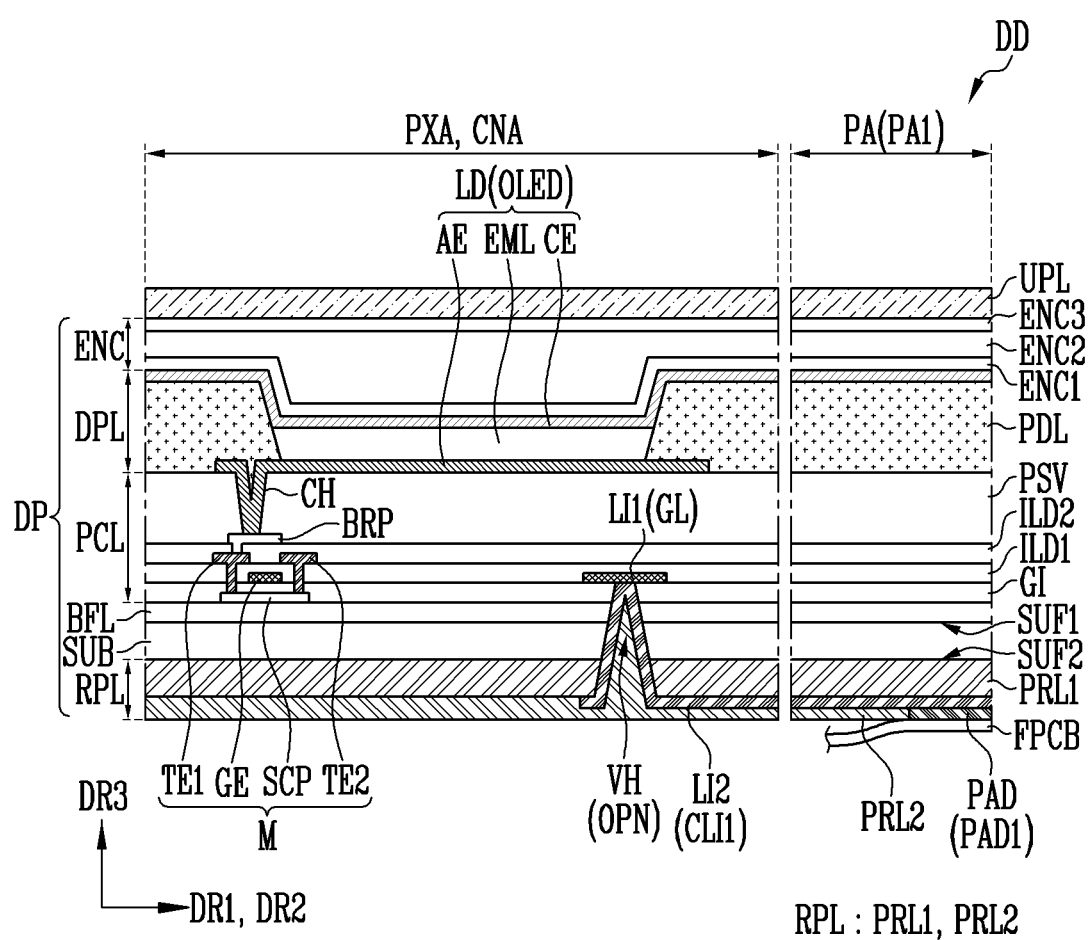

Referring to FIG. 8C, the connection area CNA may overlap at least one pixel area PXA. As an example, at least one via hole VH may penetrate through the substrate SUB so as to overlap the circuit element and/or the light emitting element LD constituting at least one pixel PXL.

Figure 8D:
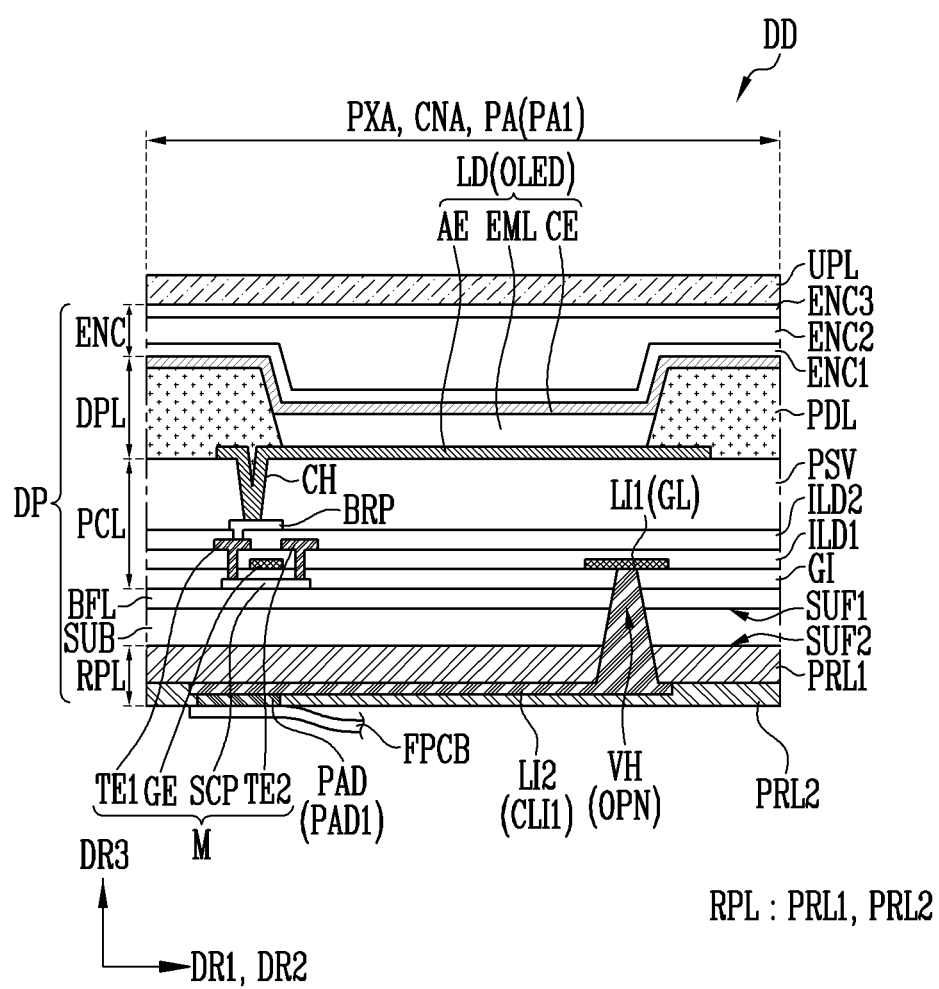
Figure 9A:
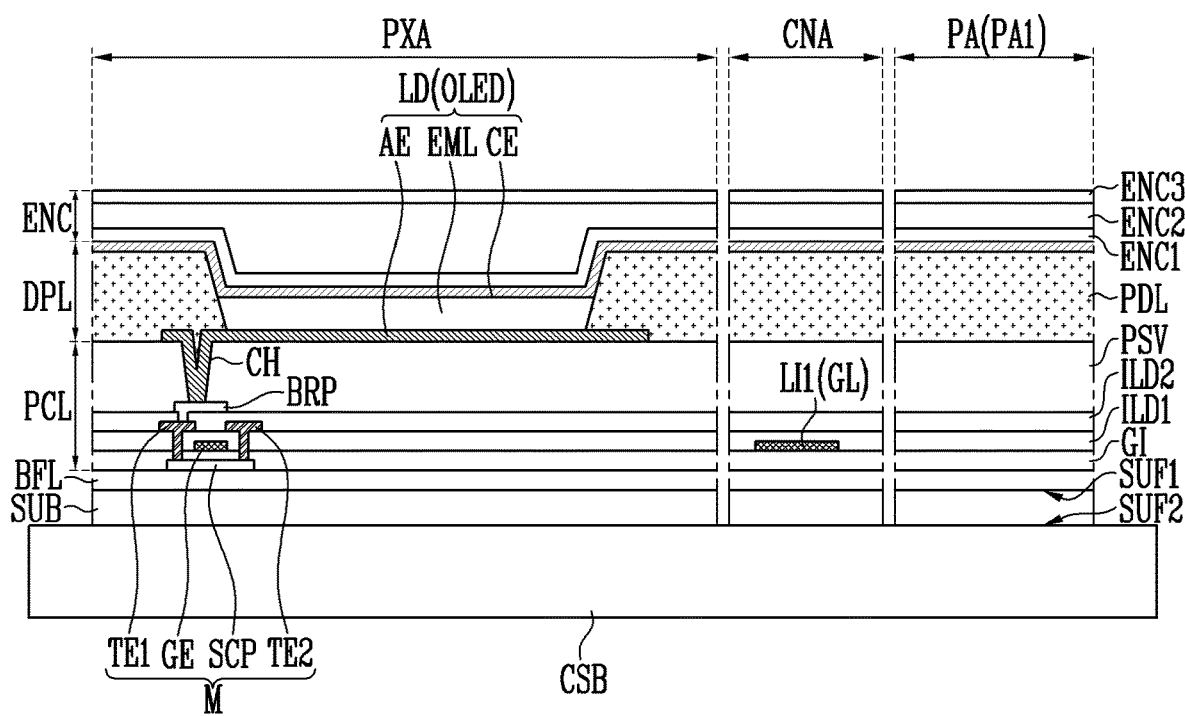
FIGS. 9A to 9H are cross-sectional views schematically illustrating a method of fabricating a display device according to an embodiment of the disclosure.
Figure 9B:
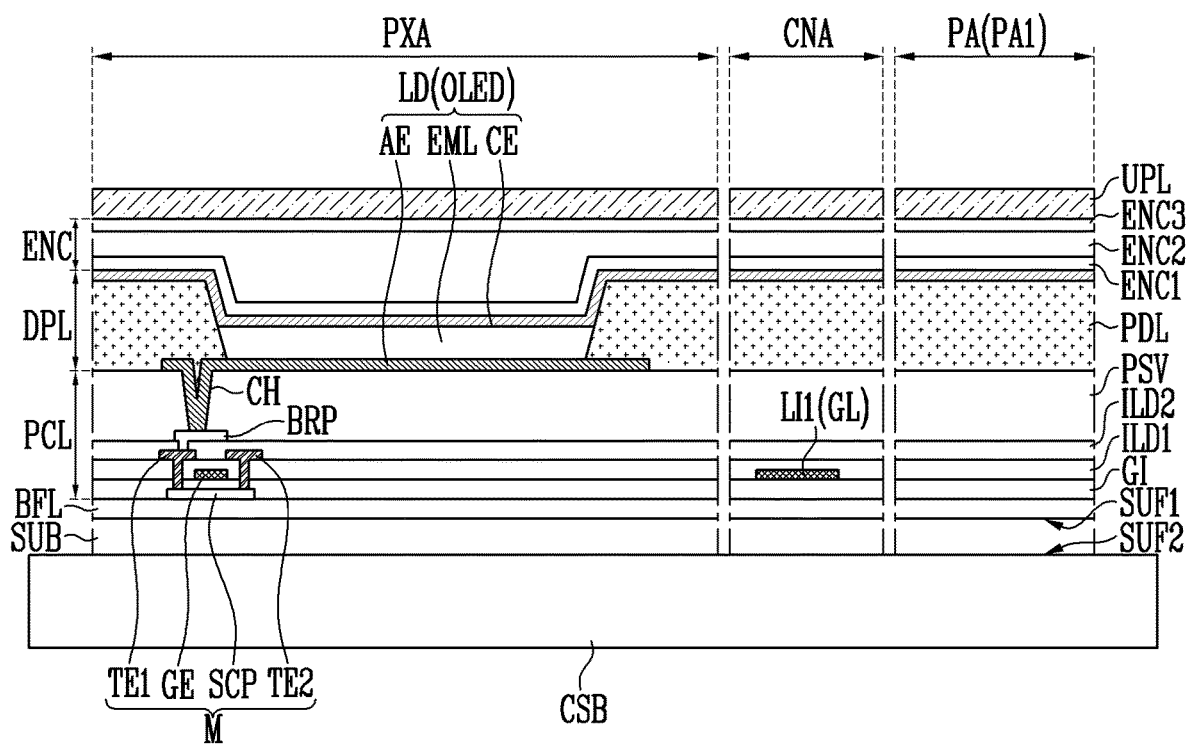
Figure 9C:
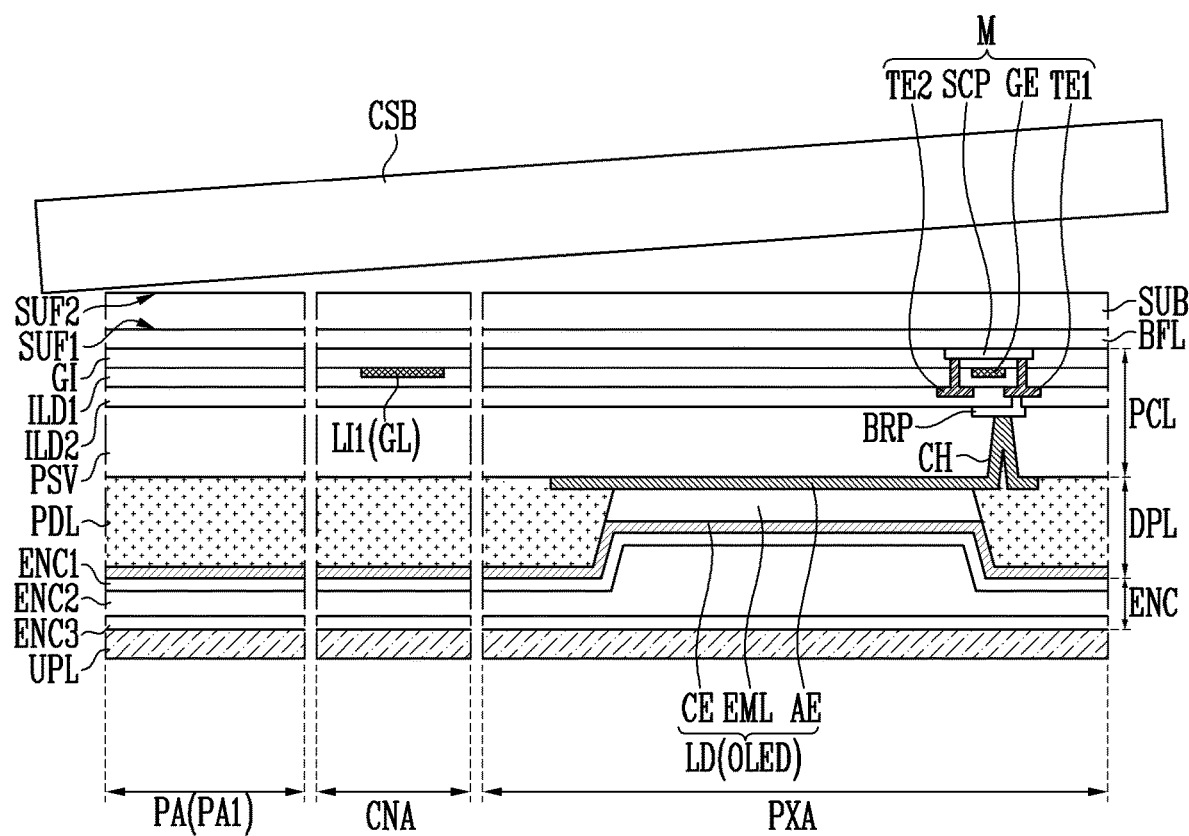
Figure 9D:
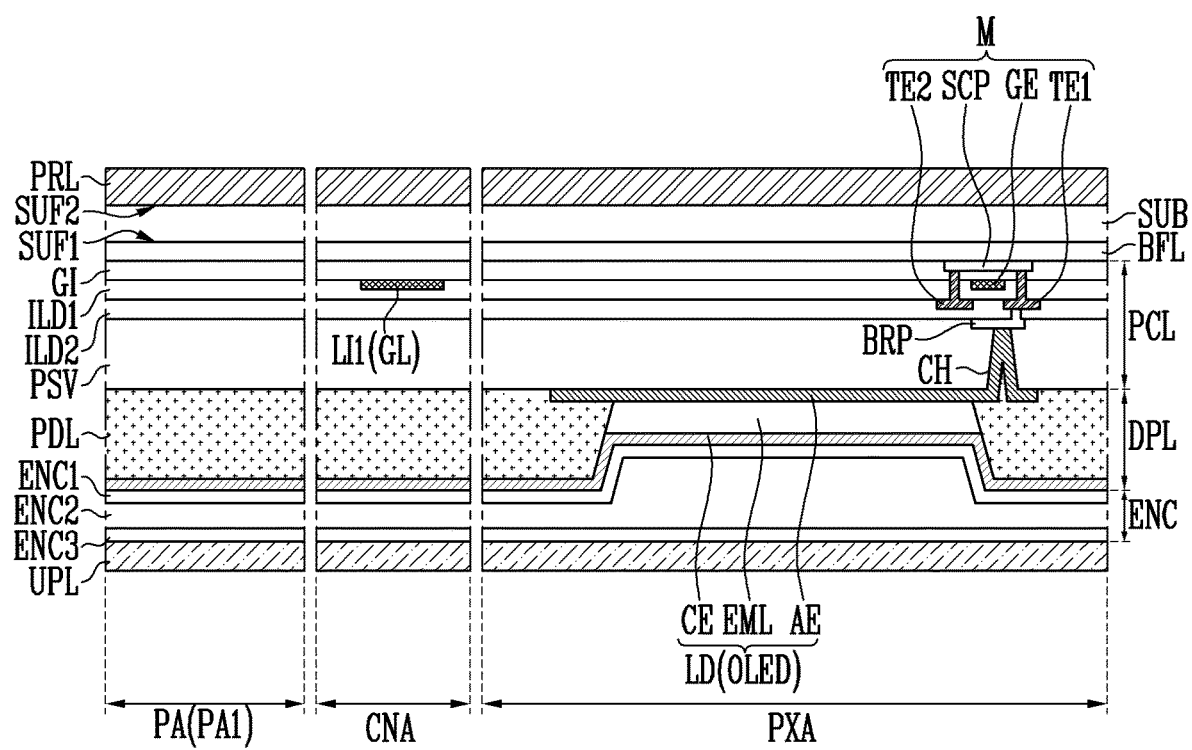
Figure 9E:
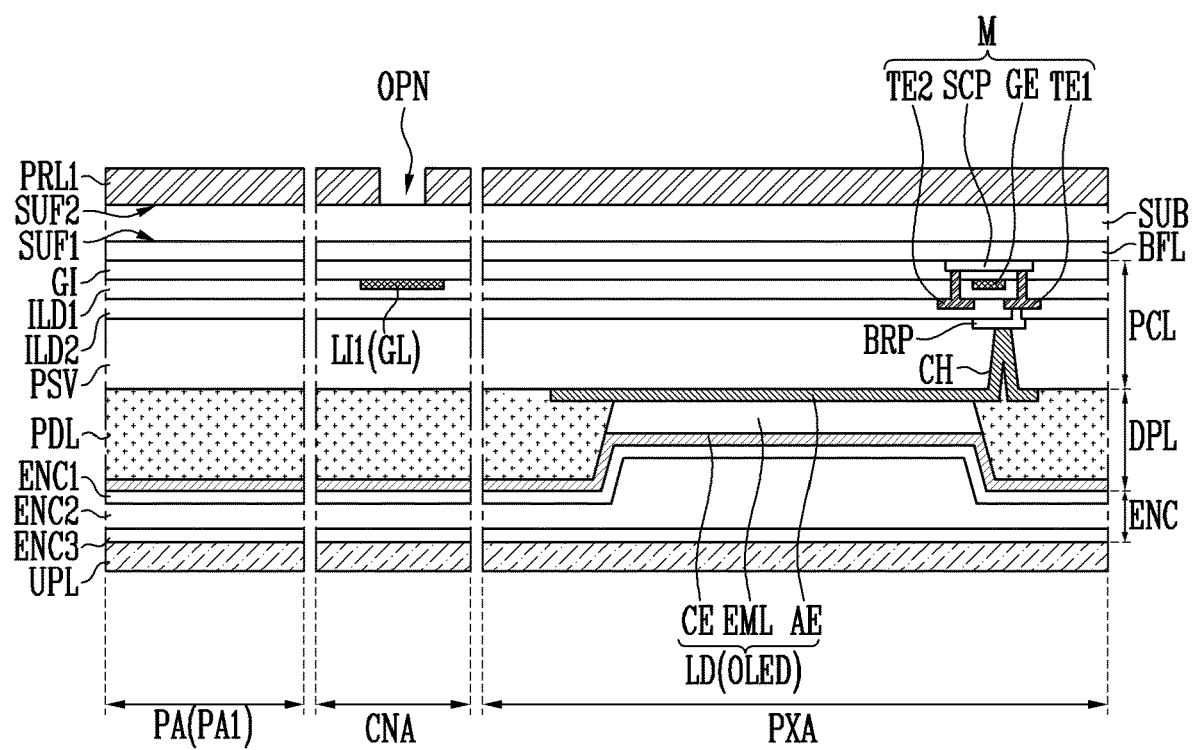
Figure 9F:
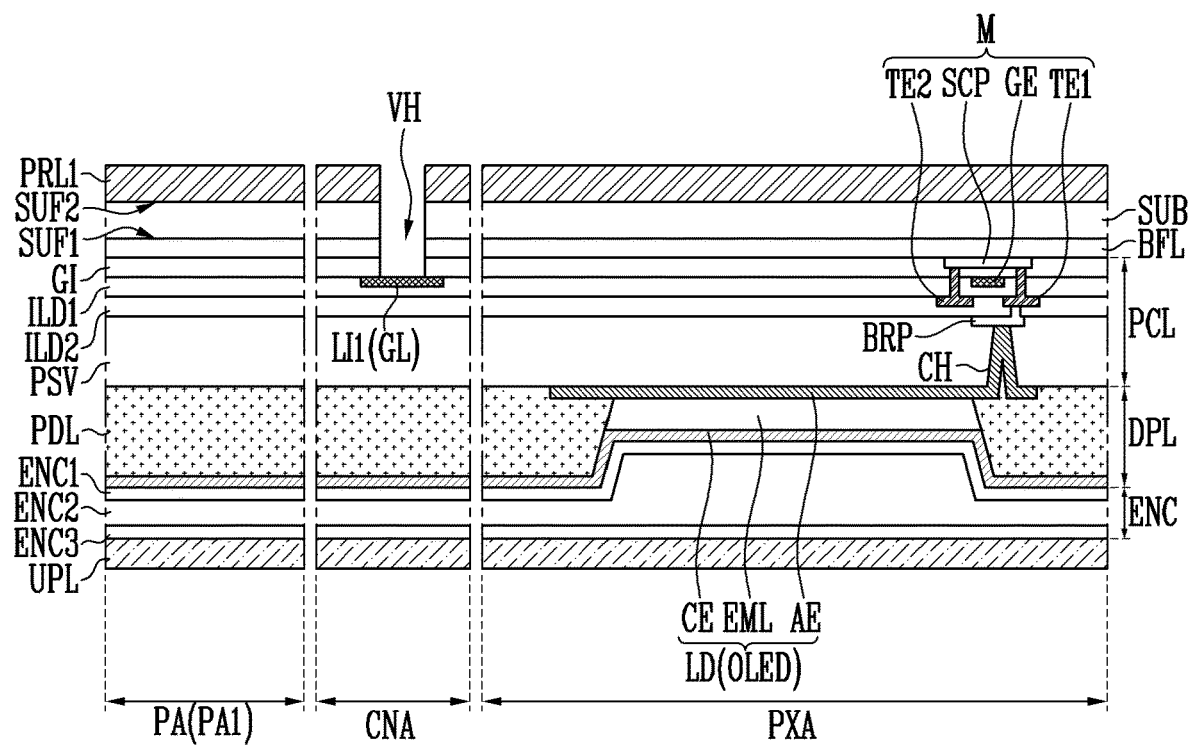
Figure 9G:
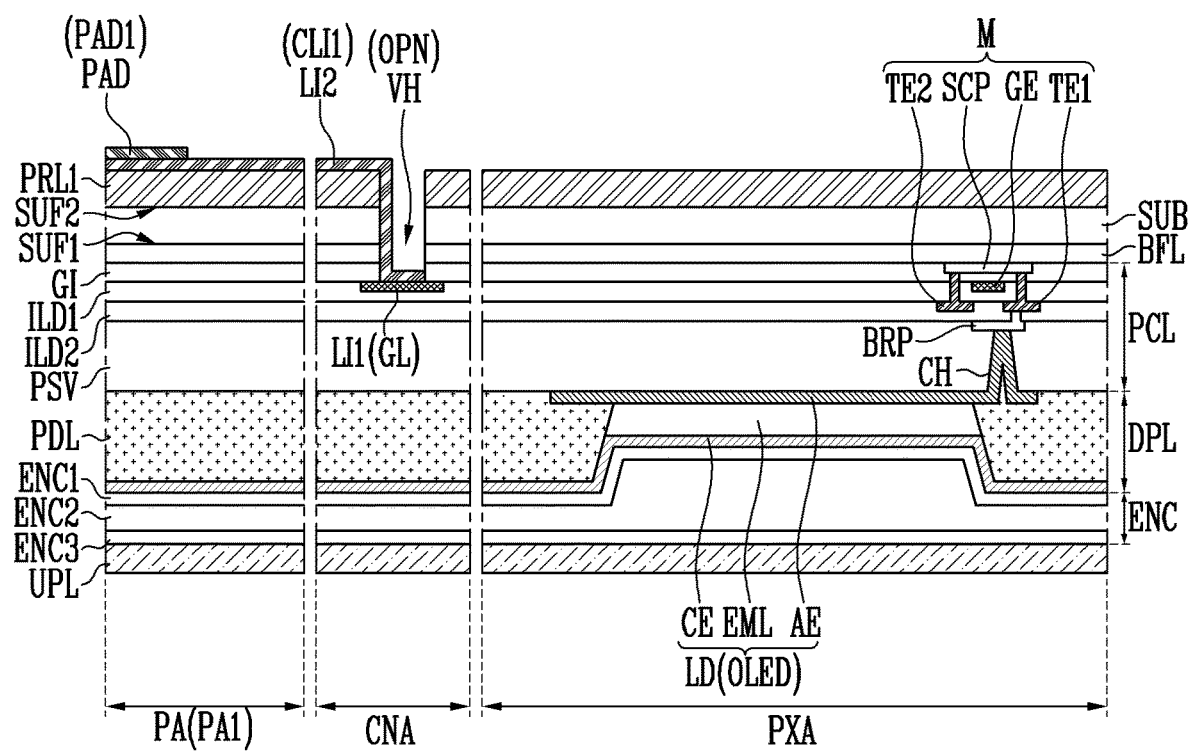
Figure 9H:
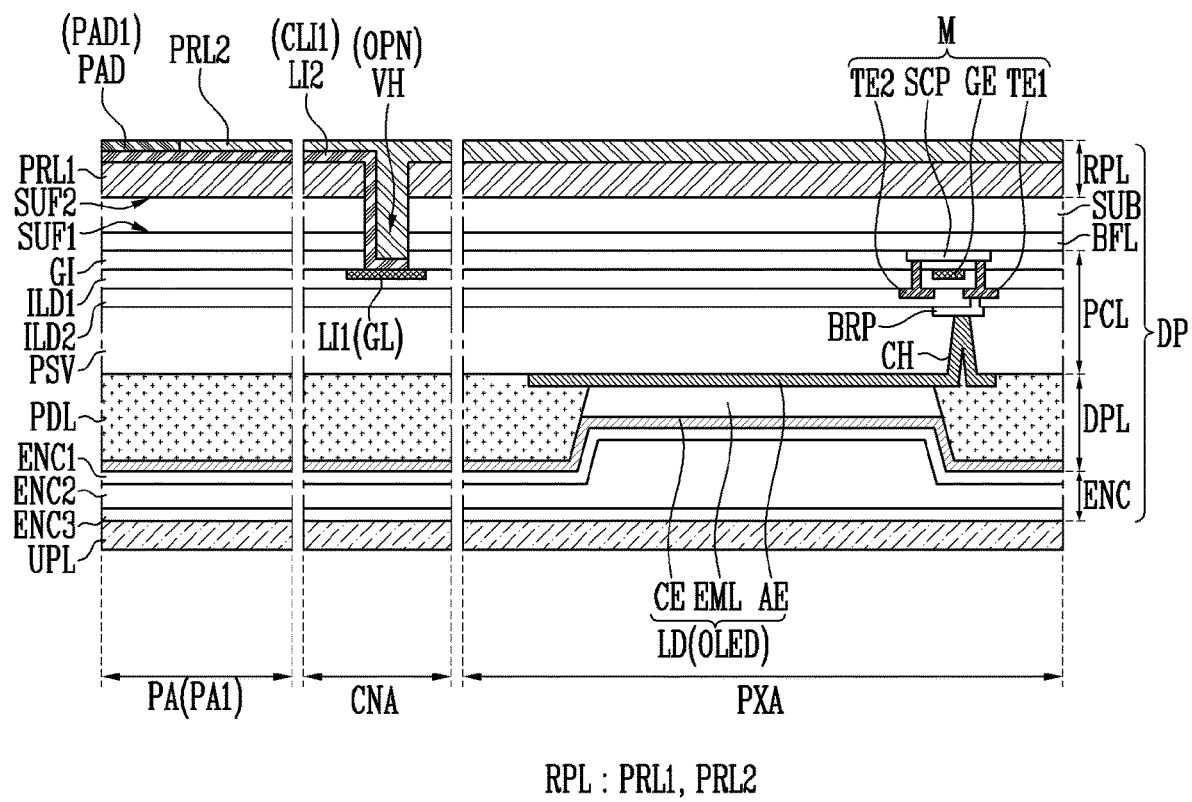

Referring to FIG. 8D, the pad area PA and the connection area CNA may overlap at least one pixel area PXA. For example, at least one pad PAD may be provided on the second surface SUF2 of the substrate SUB so as to overlap the circuit element and/or the light emitting element LD constituting at least one pixel PXL, and at least one via hole VH may penetrate through the substrate SUB so as to overlap the circuit element and/or the light emitting element LD constituting at least one pixel PXL. As an example, when viewed in a plan view, a pair of a via hole VH and a pad PAD corresponding to each other may be provided in one pixel area PXA.

Although FIGS. 8A to 8D illustrate embodiments in which the pads PAD do not overlap the via holes VH, the disclosure is not limited thereto. For example, in another embodiment, the pad PAD may be formed on (e.g., directly on) the area where the via hole VH may be formed, so that at least one via hole VH overlaps the corresponding pad PAD.

For example, the positions of the pixels PXL, the pads PAD, and the via holes VH are not particularly limited, and these may be variously changed according to embodiments.

In addition, the shape, structure, and/or size of the via hole VH may be variously changed according to embodiments. In an embodiment, the via hole VH may have sidewalls substantially perpendicular to the first surface SUF1 and the second surface SUF2 of the substrate SUB, as in embodiments of FIGS. 8A and 8B. In another embodiment, the via hole VH may have sidewalls inclined in a diagonal direction with respect to the first surface SUF1 and the second surface SUF2 of the substrate SUB, as in embodiments of FIGS. 8C and 8D.

Additionally, the shape, structure, and/or size of the second lines LI2 may be variously changed according to embodiments. In an embodiment, the second line LI2 may partially cover the sidewalls of the via hole VH, as in embodiments of FIGS. 8A and 8B. In another embodiment, the second line LI2 may completely cover the sidewalls of the via hole VH, as in embodiments of FIGS. 8C and 8D. In addition, the second line LI2 may partially fill each via hole VH as in embodiments of FIG. 8A to 8C, or may completely fill the via hole VH as in an embodiment of FIG. 8D.

FIGS. 9A to 9H are cross-sectional views schematically illustrating a method of fabricating a display device DD according to an embodiment of the disclosure. As an example, FIGS. 9A to 9H sequentially illustrate a method of fabricating the display panel DP according to an embodiment of FIG. 8A.

First, referring to FIGS. 6A to 9A, a substrate SUB including a first surface SUF1 and a second surface SUF2 may be prepared, and a buffer layer BFL may be selectively formed on the first surface SUF1 of the substrate SUB. A panel process including a process of forming pixels PXL and first lines LI1 on the first surface SUF1 of the substrate SUB on which the buffer layer BFL may be selectively provided may be performed. For example, a pixel circuit layer PCL, a display element layer DPL, and an encapsulation layer ENC may be sequentially formed on the buffer layer BFL.

According to an embodiment, the substrate SUB may be prepared on a carrier substrate CSB. A panel process for fabricating the display panel DP on the carrier substrate CSB may be performed.

Referring to FIGS. 6A to 9B, an upper protective layer UPL may be formed on the front surface of the display panel DP. For example, the upper protective layer UPL may be formed by attaching an upper protective film entirely on the first surface SUF1 of the substrate SUB to cover the pixels PXL and the first lines LI1

Referring to FIGS. 6A to 9C, the rear surface of the display panel DP may be disposed to face upward, and the carrier substrate CSB may be removed or separated from the display panel DP. For example, the carrier substrate CSB may be separated from the display panel DP through a delamination process using a laser. As the carrier substrate CSB may be separated, the second surface SUF2 of the substrate SUB may be exposed.

Referring to FIGS. 6A to 9D, a photoresist film PRL of a single layer or multiple layers may be formed on the second surface SUF2 of the substrate SUB using at least one type of photoresist material. For example, the photoresist film PRL may be formed by coating and curing a liquid photoresist material on the second surface SUF2 of the substrate SUB using liquid coating such as slit coating, spin coating, inkjet printing, or bar coating. In an embodiment, the photoresist film PRL may be formed by applying a low-temperature thermosetting type photoresist material on the second surface SUF2 of the substrate SUB and thermally curing the photoresist material at about 100° C. or lower, but the disclosure is not limited thereto.

Referring to FIGS. 6A to 9E, a first protective layer PRL1 may be formed by etching (e.g., patterning) the photoresist film PRL through a photo lithography process. For example, the photoresist film PRL may be etched in multiple areas corresponding to one area of each of the first lines LI1 (areas in which via holes VH are to be formed) to form openings OPN. In this manner, the first protective layer PRL1 may be formed.

Referring to FIGS. 6A to 9F, multiple via holes VH may be formed in the substrate SUB and/or at least one insulating layer by etching the substrate SUB and/or at least one insulating layer so that one area (e.g., a portion) of each of the first lines LI1 may be exposed using the first protective layer PRL1 as a mask. The via holes VH may be formed through a dry or wet etching process, and each via hole VH may be integrally formed with each opening OPN formed in the first protective layer PRL1.

Referring to FIGS. 6A to 9G, second lines LI2 corresponding to the first lines LI1 may be formed on the second surface SUF2 of the substrate SUB on which the first protective layer PRL1 may be provided. For example, the second lines LI2 may be formed so as to be connected to the first lines LI1 through the via holes VH. In an embodiment, the second lines LI2 may be formed using a low-resistance metal material, and may be formed through a metal filling and patterning process.

In addition, pads PAD connected to the second lines LI2 may be formed on the second surface SUF2 of the substrate SUB on which the first protective layer PRL1 may be provided. In an embodiment, the pads PAD may be formed non-integrally with the second lines LI2, and the second lines LI2 and the pads PAD may be sequentially formed. In another embodiment, the pads PAD may be formed integrally with the second lines LI2, and the second lines LI2 and the pads PAD may be simultaneously formed.

Referring to FIGS. 6A to 9H, a second protective layer PRL2 may be formed on the second surface SUF2 of the substrate SUB so as to cover the first protective layer PRL1 and the second lines LI2. In an embodiment, the lower protective layer RPL including the first protective layer PRL1 and the second protective layer PRL2 may be formed to a thickness in a range of about 20 μm to about 200 μm, considering the thickness and/or modulus condition of the display device DD.

The second protective layer PRL2 may be formed on the second surface SUF2 of the substrate SUB so as to expose the pads PAD. In addition, the second protective layer PRL2 may be formed to planarize the upper portion of the second surface SUF2 of the substrate SUB on which the first protective layer PRL1, the second lines LI2, and the pads PAD may be formed.

For example, the second protective layer PRL2 may be formed by coating and curing an organic photoresist material on the remaining areas except for the pad area PA (or one area of the pad area PA). In addition, the upper portion of the second surface SUF2 of the substrate SUB may be planarized by forming the second protective layer PRL2 so that the surfaces of the pads PA and the second protective layer PRL2 may be substantially at the same height.

Thereafter, the display panel DP may be connected to the driving circuit through the pads PAD in a module process or the like.

According to an above-described embodiment, the photo mask may be used as the first protective layer PRL1 without removing the photo mask used to form the via holes VH. Therefore, the process of removing the photo mask may be omitted. In addition, by forming the lower protective layer RPL on the rear surface of the display panel DP, impact resistance of the display panel DP may be secured without attaching a separate lower protective film Therefore, a secondary process such as input of the lower protective film and discharge of a release paper may be omitted.

In addition, by forming the lower protective layer RPL through a coating process and a photo lithography process, the lower protective layer RPL may be easily formed at a desired position. Therefore, even for the large display panel DP, the lower protective layer RPL may be easily formed at a desired position, and an alignment error may be reduced or prevented compared to the case of attaching a separate lower protective film. In addition, it may be possible to easily control the application area of the photoresist material, thereby reducing material costs.

Therefore, according to the above-described embodiments, it may be possible to simplify and/or facilitate the process of fabricating a display device DD and reduce fabrication costs.

Figure 10:
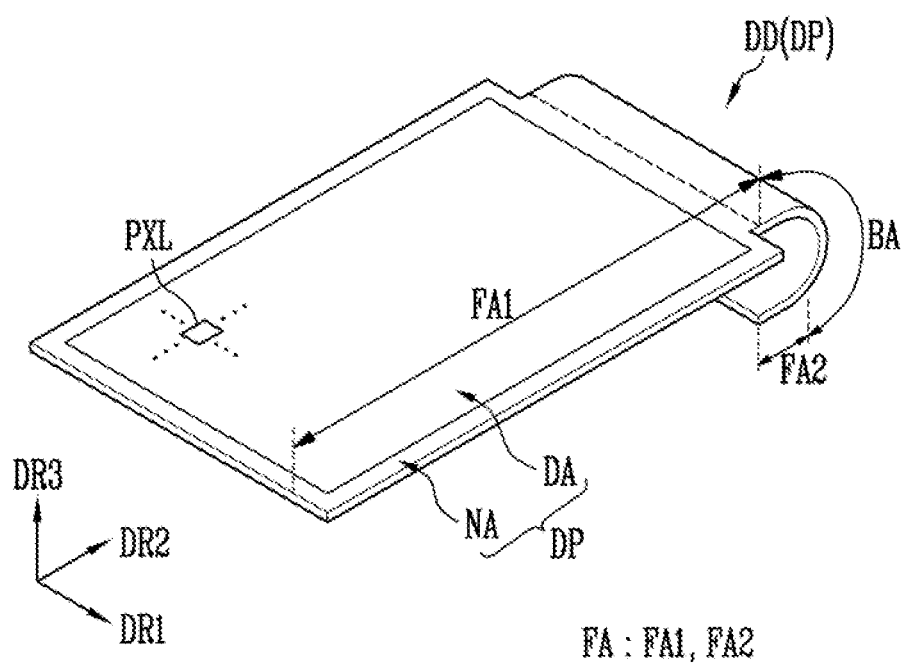
FIG. 10 is a perspective view schematically illustrating a display device according to an embodiment of the disclosure.

FIG. 10 is a perspective view schematically illustrating a display device DD according to an embodiment of the disclosure. According to an embodiment, in FIG. 10, a display device DD including a display panel DP that may be foldable or bendable in a non-display area NA is disclosed, and the structure of the display device DD is schematically illustrated.

For convenience, FIG. 10 illustrates that the display device DD has a substantially rectangular shape. An extending direction of a short side may be indicated by a first direction DR1, an extending direction of a long side may be indicated by a second direction DR2, and a direction perpendicular to the extending directions of the long side and the short side (e.g., a thickness or height direction of the display device DD) may be indicated by a third direction DR3. However, this may be changed according to the shape of the display device DD.

Referring to FIG. 10, at least one area of the display device DD (in particular, the display panel DP) may have flexibility, and the display device DD may be foldable at the flexible portion. In describing embodiments of the disclosure, the term "foldable" may comprehensively mean that the shape may not be fixed but can be transformed from the original shape to another shape. For example, in describing embodiments of the disclosure, the term "foldable" means that a portion may be folded, bent or curved, or rolled along one or more specific lines, e.g., a folding line.

For example, the display device DD may include a bending area BA having flexibility and a flat area FA that may be continuous and flat on at least one side of the bending area BA. The bending area BA may be foldable due to flexibility. The flat area FA may or may not have flexibility.

The flat area FA may include a first flat area FA1 and a second flat area FA2 spaced apart from each other with the bending area BA therebetween. One surface of the first flat area FA1 and one surface of the second flat area FA2 may face each other.

The first flat area FA1 may be provided in at least a portion of the display area DA and/or the non-display area NA, and the bending area BA may be continuously disposed in the first flat area FA1. The bending area BA may be integrally formed with the first flat area FA1, but the disclosure is not limited thereto. The second flat area FA2 may be continuously disposed in the bending area BA. The second flat area FA2 may be integrally formed with the bending area BA, but the disclosure is not limited thereto.

In an embodiment, the bending area BA may be provided in the non-display area NA in which the pixels PXL may not be formed. For example, the non-display area NA may include a protruding area protruding from a portion thereof in at least one direction (e.g., the second direction DR2), and may be foldable or bendable in the protruding area. As an example, the first flat area FA1 may be provided in the display area DA and/or the non-display area NA therearound, and the bending area BA and the second flat area FA2 may be provided in the protruding area of the non-display areas NA. The protruding area of the non-display area NA may be bendable or foldable, and thus the width of the bezel may be reduced.

Figure 11:
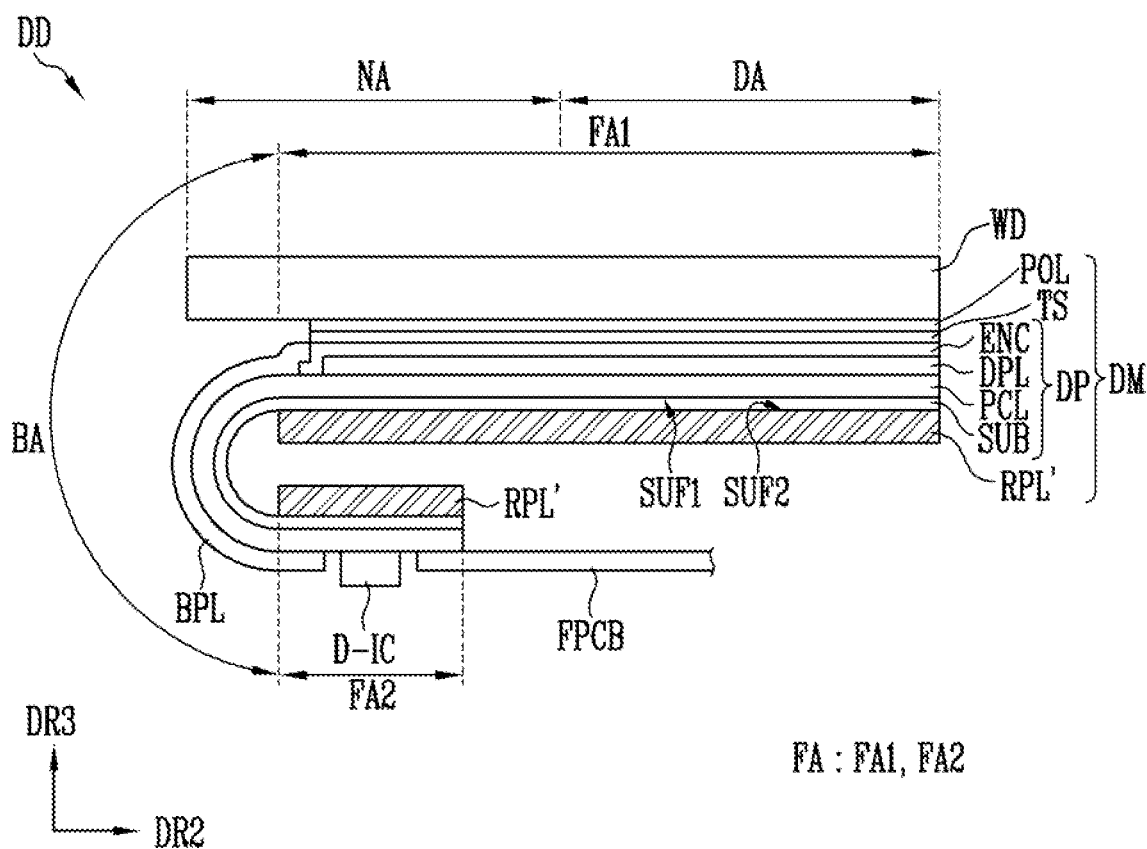
FIG. 11 is a cross-sectional view schematically illustrating a display device according to an embodiment of the disclosure.

FIG. 11 is a cross-sectional view schematically illustrating a display device DD according to an embodiment of the disclosure. For example, FIG. 11 illustrates a display device DD including a display panel DP that may be foldable or bendable in a non-display area NA as in an embodiment of FIG. 10. In describing embodiments of FIGS. 10 and 11, the same reference numerals are assigned to elements that may be similar or identical to those of the above-described embodiment, and detailed descriptions thereof will be omitted.

Referring to FIGS. 10 and 11, the display device DD may include a display module DM including at least a display panel DP, and a window WD provided on the display module DM. One area of the display module DM corresponding to the non-display area NA may be foldable or bendable in the rear direction, and the driving circuit D-IC may be mounted on the rear surface of the display module DM.

Specifically, the display device DD may include the display area DA and the non-display area NA, and may include the flat area FA and the bending area BA. The flat area FA and the bending area BA may be divided based on the display panel DP. For example, the flat area FA and the bending area BA may be determined according to whether the display panel DP may be bent and the positions thereof.

The flat area FA may include a first flat area FA1 and a second flat area FA2 with the bending area BA therebetween. The second flat area FA2 may face the first flat area FA1 with the bending area BA therebetween in a state in which the display panel DP may be bent.

The window WD may be provided above the display module DM to correspond to a portion of the bending area BA and the first flat area FA1.

The display module DM may include a display panel DP and a lower protective layer RPL' provided on the rear surface of the display panel DP. In addition, the display module DM may optionally further include at least one of a touch sensor TS and a polarization layer POL. In an embodiment, the touch sensor TS and the polarization layer POL may be disposed on the front surface of the display panel DP so as to be provided between the display panel DP and the window WD, but the disclosure is not limited thereto.

Some elements of the display module DM may be provided only in the first flat area FA, and the remaining elements may also be provided in the bending area BA and the second flat area FA2. For example, some elements of the display panel DP (e.g., the display element layer DPL and the encapsulation layer ENC), the touch sensor TS, and/or the polarization layer POL may be provided to correspond only to the first flat area FA1. The remaining elements of the display panel DP (e.g., the substrate SUB and the pixel circuit layer PCL) may be provided to correspond to the first flat area FA, the bending area BA, and the second flat area FA2.

The display panel DP may include a substrate SUB, and a pixel circuit layer PCL, a display element layer DPL, and an encapsulation layer ENC, which may be provided on a first surface SUF1 of the substrate SUB.

The substrate SUB may have flexibility at least in the bending area BA, and thus may be foldable or bendable in the bending area BA. For example, the substrate SUB may be one of a film substrate and a plastic substrate including a polymer organic material. As an example, the substrate SUB may be a polyimide substrate, but the disclosure is not limited thereto.

The display module DM may further include a bending protective layer BPL provided on the bending portion BA so as to prevent damage to the bending portion BA.

The bending protective layer BPL may include a polymer compound, may minimize the occurrence of cracks due to stress applied to the substrate SUB when the display panel DP is bent, and may block propagation of cracks. Therefore, the durability of the display module DM may be improved. The bending protective layer BPL may be provided to correspond to the bending area BA. In addition, the bending protective layer BPL may be provided in one area of the first and/or second flat areas FA1 and FA2 around the bending area BA.

A driving circuit D-IC may be mounted on the rear surface of the display panel DP corresponding to the second flat area FA. For example, the driving circuit D-IC may be provided on the first surface SUF1 of the substrate SUB bent toward the rear surface of the display device DD, and may be disposed to overlap the pixel circuit layer PCL so as to be connected to circuit elements and/or lines formed on the pixel circuit layer PCL.

In an embodiment, the driving circuit D-IC may be mounted in the form of a single chip or multiple chips, but the disclosure is not limited thereto.

The driving circuit D-IC may include a display driver and/or a touch driver for driving the pixels PXL and/or the touch sensor TS. For example, the driving circuit D-IC may include a scan driver, a data driver, and/or a touch driver.

In addition, pads (not illustrated) may be provided on the rear surface of the display panel DP corresponding to the second flat area FA2, and the display panel DP may be connected to the circuit board FPCB through the pads. The circuit board FPCB may be a main flexible circuit board for connection with a host processor or the like, but the disclosure is not limited thereto.

The lower protective layer RPL' may be provided in the area corresponding to the first flat area FA1 and the second flat area FA2. For example, the lower protective layer RPL' may be provided on the second surface SUF2 of the substrate SUB in the area corresponding to the first flat area FA1 and the second flat area FA2.

The lower protective layer RPL' may not be provided in the bending area BA, or may be provided in the bending area BA with a thickness smaller than that of the first and/or second flat areas FA1 and FA2. For example, the lower protective layer RPL' may include an opening or a separation area corresponding to at least one area of the bending area BA.

In an embodiment of the disclosure, the lower protective layer RPL' may be formed on (e.g., directly formed on) the second surface SUF2 of the substrate SUB. In this case, the lower protective layer RPL' may be regarded as an element of the display panel DP. However, for convenience of explanation, in embodiments of FIGS. 11 and 12A to 12F to be described later, the lower protective layer RPL' is illustrated as a separate element separated from the display panel DP.

The lower protective layer RPL' may be a single layer or multiple layers including a photoresist material. In this case, the lower protective layer RPL' may be easily patterned. For example, the lower protective layer RPL' may be easily formed at a desired position through a coating process and a photo lithography process using at least one type of photoresist material. In addition, the thickness and/or the shape of the lower protective layer RPL' may be easily controlled. For example, the thickness of the lower protective layer RPL' may be precisely controlled for each position, or may be easily patterned into a desired shape.

In an embodiment, the lower protective layer RPL' may be formed using a photoresist material that may be cured at about 100° C. or lower. In this case, it may be possible to prevent or minimize damage to devices that may be susceptible to heat damage, such as an organic light emitting diode (OLED).

In addition, the lower protective layer RPL' may be formed to have a range of thickness and/or modulus set considering various conditions such as impact resistance, thickness, and/or flexibility of the display device DD (in particular, the display panel DP). For example, the lower protective layer RPL' may have a thickness in a range of about 10 μm to about 200 μm, and may have a modulus in a range of about 1 MPa to about 5 GPa.

FIGS. 12A to 12F are cross-sectional views schematically illustrating a method of fabricating a display device DD according to an embodiment of the disclosure. As an example, FIGS. 12A to 12F sequentially illustrate a method of fabricating the display panel DP according to an embodiment of FIGS. 10 and 11. According to an embodiment, a method of fabricating a display device DD will be described with reference to FIGS. 12A to 12F, centering on a process of forming a display panel DP and a lower protective layer RPL', and the illustration of the detailed configuration of the display panel DP will be omitted. In addition, in describing embodiments of FIGS. 12A to 12F, the same reference numerals are assigned to elements that may be similar or identical to those of an above-described embodiment (e.g., embodiments of FIGS. 9A to 9H), and detailed descriptions thereof will be omitted.

Referring to FIGS. 10 to 12A, after a display panel DP may be fabricated on a carrier substrate CSB, an upper protective layer UPL may be formed on the front surface of the display panel DP. For example, the upper protective layer UPL may be formed by attaching an upper protective film on the front surface of the display panel DP.

Referring to FIGS. 10 to 12B, the carrier substrate CSB may be removed or separated from the display panel DP. For example, the carrier substrate CSB may be separated from the display panel DP through a delamination process using a laser.

Referring to FIGS. 10 to 12C, a photoresist film PRL may be formed on the rear surface of the display panel DP using a photoresist material. For example, the photoresist film PRL may be formed by coating and curing a liquid photoresist material (e.g., an organic photoresist material) on the second surface of the display panel DP using liquid coating such as slit coating, spin coating, inkjet printing, or bar coating. In an embodiment, the photoresist film PRL may be formed by applying a low-temperature thermosetting type photoresist material on the rear surface of the display panel DP and thermally curing the applied photoresist material at about 100° C. or lower.

Figure 12A:
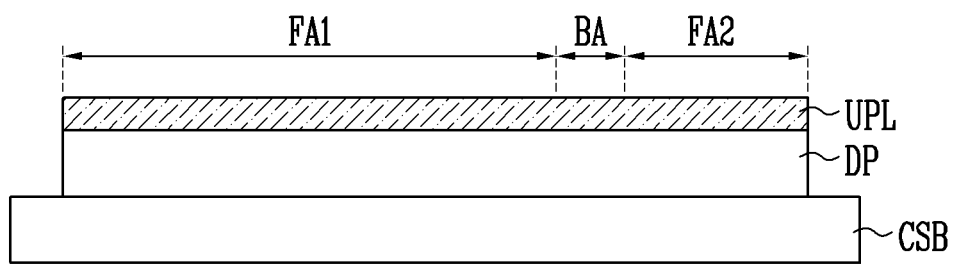
FIGS. 12A to 12F are cross-sectional views schematically illustrating a method of fabricating a display device according to an embodiment of the disclosure.
Figure 12B:
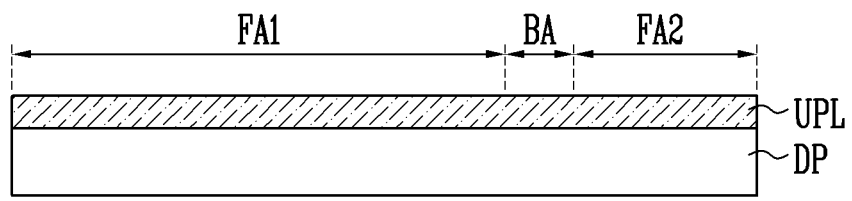
Figure 12C:
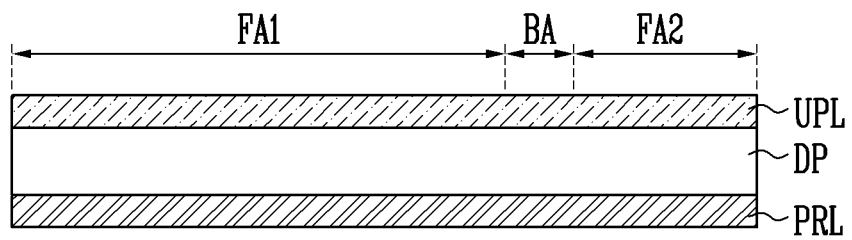
Figure 12D:
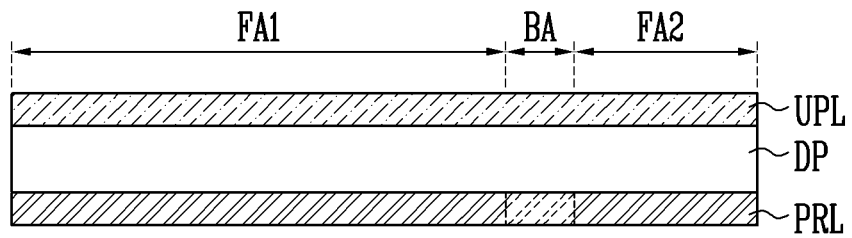
Figure 12E:
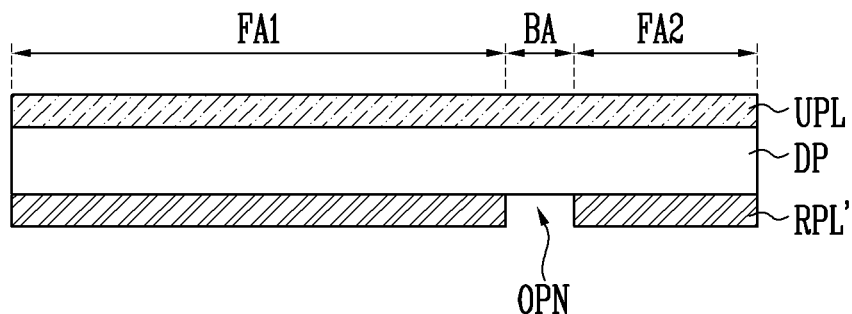
Figure 12F:
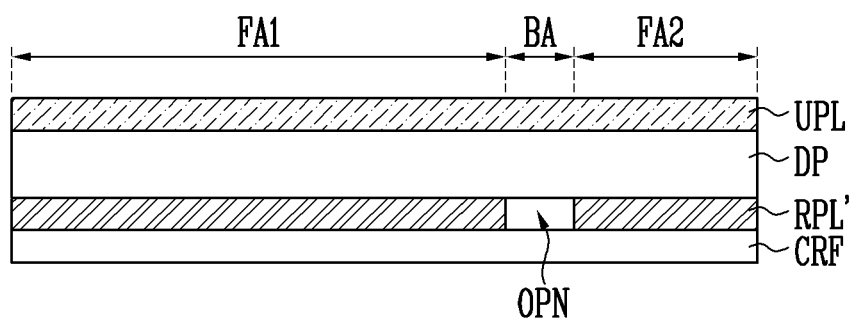

Referring to FIGS. 10 to 12E, a lower protective layer RPL' may be formed by etching (patterning) the photoresist film PRL through a photo lithography process. For example, as illustrated in FIG. 12D, the lower protective layer RPL' including the opening OPN in the bending area BA may be formed by exposing the photoresist film PRL in the area corresponding to the bending area BA as illustrated in FIG. 12D and etching the photoresist film PRL as illustrated in FIG. 12E. In other embodiments, by etching the photoresist film PRL to a certain thickness in the area corresponding to the bending area BA, the lower protective layer RPL' having a reduced thickness in the bending area may be formed.

Therefore, the lower protective layer RPL' may be formed on the rear surface of the display panel DP.

Referring to FIGS. 10 to 12F, a carrier film CRF may be attached on the rear surface of the display panel DP on which the lower protective layer RPL' may be provided. The carrier film CRF may be removed in a subsequent module process.

In case that the lower protective layer RPL' according to embodiments of FIGS. 10 to 12F is applied, the formation position, thickness, and shape of the lower protective layer RPL' may be controlled more easily and precisely and the fabrication costs may be reduced, compared to the case of attaching a separate lower protective film to the rear surface of the display panel DP. In addition, with respect to the bending portion BA, the curvature of the bending portion BA may be reduced by removing the lower protective layer RPL' or reducing the thickness thereof. As the curvature of the bending portion BA may be reduced, the non-display area NA of the display device DD may be reduced or minimized.

In the display device DD and the fabricating method thereof according to various embodiments of the disclosure as described above, by forming the lower protective layers RPL and/or RPL' including the photoresist material on the rear surface of the display panel DP, the lower protective layers RPL and/or RPL' may be easily formed on the rear surface of the display panel DP without attaching and/or patterning a separate lower protective film. Accordingly, it may be possible to simplify and/or facilitate the process of fabricating the display device DD and to reduce fabrication costs. In addition, even for the large display panel DP, the lower protective layers RPL and RPL' (or a protective layer) may be easily formed at a desired position.

Effects according to embodiments are not limited by the above contents, and various other effects are incorporated in the specification.

Although aspects of the disclosure have been described in detail according to the above-described embodiments, it should be noted that the above embodiments are for the purpose of explanation and not for the limitation thereof. In addition, those of ordinary skill in the art will appreciate that various modifications can be made thereto within the scope of the spirit of the disclosure.

Therefore, the scope of the disclosure should not be limited to the contents described in the detailed description of the specification. In addition, it should be construed that all changes or modifications derived here from fall within the scope of the disclosure.

What is claimed is:

1. A display device comprising:
   a substrate including a first surface and a second surface;
   pixels and first lines disposed on the first surface of the substrate;
   a first protective layer disposed on the second surface of the substrate and overlapping the pixels and the first lines;
   via holes penetrating the substrate and the first protective layer and exposing an area of each of the first lines;
   second lines disposed on a surface of the first protective layer and electrically connected to the first lines through the via holes, respectively; and
   pads disposed on the surface of the first protective layer and electrically connected to the second lines, respectively, wherein
   the first protective layer includes openings corresponding to the via holes, and
   the first protective layer includes a photoresist material.

2. The display device of claim 1, wherein the first protective layer has a thickness in a range of about 10 μm to about 200 μm.

3. The display device of claim 1, wherein the first protective layer has a modulus in a range of about 1 MPa to about 5 GPa.

4. The display device of claim 1, wherein the first protective layer includes an organic photoresist material that is cured at about 100° C. or lower.

5. The display device of claim 1, further comprising a second protective layer disposed on the second surface of the substrate and overlapping the first protective layer and the second lines,
   wherein the first protective layer and the second protective layer constitute a lower protective layer disposed on the second surface of the substrate.

6. The display device of claim 5, wherein the second protective layer and the first protective layer include a same photoresist material.

7. The display device of claim 5, wherein the second protective layer and the first protective layer include different photoresist materials.

8. The display device of claim 5, wherein the lower protective layer has a thickness in a range of about 20 μm to about 200 μm.

9. The display device of claim 5, wherein the lower protective layer has a modulus in a range of about 1 MPa to about 5 GPa.

10. The display device of claim 5, wherein the second protective layer includes an organic photoresist material that is cured at about 100° C. or lower.

11. The display device of claim 5, wherein a surface of the second protective layer and surfaces of the pads are at a same height.

12. The display device of claim 1, further comprising an upper protective layer disposed on the first surface of the substrate and overlapping the pixels and the first lines.

13. The display device of claim 1, wherein at least one of the pixels overlaps at least one of the pads.

14. The display device of claim 1, wherein at least one of the pixels overlaps at least one of the via holes.

15. The display device of claim 1, further comprising a circuit board disposed on the second surface of the substrate and electrically connected to the pads.

16. A method of fabricating a display device, the method comprising:
- preparing a substrate including a first surface and a second surface;
- forming pixels and first lines on the first surface of the substrate;
- forming an upper protective layer on the first surface of the substrate to overlap the pixels and the first lines;
- forming a photoresist film on the second surface of the substrate using a photoresist material;
- forming a first protective layer by etching the photoresist film in a plurality of areas each corresponding to an area of each of the first lines through a photo lithography process;
- forming via holes in the substrate using the first protective layer as a mask to expose the area of each of the first lines;
- forming second lines on the second surface of the substrate, on which the first protective layer is formed, the second lines corresponding to the first lines and being electrically connected to the first lines through the via holes;
- forming pads electrically connected to the second lines on the second surface of the substrate; and
- forming a second protective layer on the second surface of the substrate to overlap the first protective layer and the second lines.

17. The method of claim 16, wherein the forming of the photoresist film includes:
- applying the photoresist material on the second surface of the substrate through a liquid coating process; and
- thermally curing the photoresist material at about 100° C. or lower.

18. The method of claim 17, wherein a lower protective layer including the first protective layer and the second protective layer is formed to a thickness in a range of about 20 μm to about 200 μm.

19. The method of claim 16, wherein the second protective layer is formed on the second surface of the substrate to planarize an upper portion of the second surface of the substrate on which the second lines and the pads are disposed.

* * * * *